US012803599B2

(12) United States Patent
Kogure et al.

(10) Patent No.: US 12,803,599 B2
(45) Date of Patent: Nov. 17, 2026

(54) TRACKER MODULE AND COMMUNICATION DEVICE

(71) Applicant: Murata Manufacturing Co., Ltd., Nagaokakyo (JP)

(72) Inventors: Takeshi Kogure, Nagaokakyo (JP); Tomohide Aramata, Nagaokakyo (JP); Yuuki Fukuda, Nagaokakyo (JP); Toshiki Matsui, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 178 days.

(21) Appl. No.: 18/616,848

(22) Filed: Mar. 26, 2024

(65) Prior Publication Data

US 2024/0235585 A1 Jul. 11, 2024

Related U.S. Application Data

(63) Continuation of application No. PCT/JP2022/035968, filed on Sep. 27, 2022.

(30) Foreign Application Priority Data

Sep. 29, 2021 (JP) ................................ 2021-159619

(51) Int. Cl.

*H04B 1/04* (2006.01)
*H03F 1/02* (2006.01)
*H03F 3/213* (2006.01)

(52) U.S. Cl.

CPC ................ *H04B 1/04* (2013.01); *H03F 1/02* (2013.01); *H03F 3/213* (2013.01); *H04B 2001/0408* (2013.01)

(58) Field of Classification Search

CPC ..... H04B 1/04; H04B 2001/0408; H03F 1/02; H03F 3/213; H03F 1/0227;

(Continued)

(56) References Cited

U.S. PATENT DOCUMENTS 6,683,767 B2 1/2004 Ito et al.
6,940,724 B2 9/2005 Divakar et al.

(Continued)

FOREIGN PATENT DOCUMENTS

JP 2009-224817 A 10/2009
JP 4565374 B2 10/2010

(Continued)

OTHER PUBLICATIONS

Lu et al., "Design Considerations of Distributed and Centralized Switched-Capacitor Converters for Power Supply On-Chip", IEEE Journal of emerging and selected topics in power electronics, vol. 6, No. 2, Jun. 2018, pp. 515-525.

(Continued)

*Primary Examiner* — Matthew D. Anderson
(74) *Attorney, Agent, or Firm* — ArentFox Schiff LLP

(57) ABSTRACT

A tracker module is provided that includes a module substrate, an integrated circuit disposed on the module substrate, and a capacitor disposed on the module substrate and included in a switched-capacitor circuit. The switched-capacitor circuit generates multiple discrete voltages based on an input voltage. The integrated circuit includes a switch included in the switched-capacitor circuit and a switch included in an output switch circuit. The output switch circuit selectively outputs at least one of the multiple discrete voltages. The integrated circuit and the capacitor are adjacent to each other.

20 Claims, 5 Drawing Sheets

(58) Field of Classification Search
CPC ............... H03F 2200/102; H03F 3/005; H03F 2200/267; H03F 2200/451; H03F 1/025; H03F 3/195; H03F 3/245; H03F 3/189; H02M 1/0006; H02M 1/007; H02M 1/008; H02M 3/003; H02M 3/07; H02M 3/158; H10W 70/611; H10W 70/685; H10W 72/00
See application file for complete search history.

(56) References Cited

U.S. PATENT DOCUMENTS

| | | | |
|---|---|---|---|
| 7,190,210 | B2 | 3/2007 | Azrai et al. |
| 7,746,041 | B2 | 6/2010 | Xu et al. |
| 7,777,459 | B2 | 8/2010 | Williams |
| 7,782,027 | B2 | 8/2010 | Williams |
| 7,786,712 | B2 | 8/2010 | Williams |
| 7,812,579 | B2 | 10/2010 | Williams |
| 7,977,927 | B2 | 7/2011 | Williams |
| 7,978,031 | B2 | 7/2011 | Goi et al. |
| 8,212,541 | B2 | 7/2012 | Perreault et al. |
| 8,824,978 | B2 | 9/2014 | Briffa et al. |
| 8,829,993 | B2 | 9/2014 | Briffa et al. |
| 8,830,709 | B2 | 9/2014 | Perreault |
| 8,830,710 | B2 | 9/2014 | Perreault et al. |
| 8,849,362 | B1 | 9/2014 | Saji et al. |
| 8,860,396 | B2 | 10/2014 | Giuliano |
| 8,957,727 | B2 | 2/2015 | Dawson et al. |
| 9,020,453 | B2 | 4/2015 | Briffa et al. |
| 9,143,032 | B2 | 9/2015 | Le et al. |
| 9,160,287 | B2 | 10/2015 | Briffa et al. |
| 9,166,536 | B2 | 10/2015 | Briffa et al. |
| 9,172,336 | B2 | 10/2015 | Briffa et al. |
| 9,209,758 | B2 | 12/2015 | Briffa et al. |
| 9,490,752 | B2 | 11/2016 | Briffa et al. |
| 9,531,291 | B2 | 12/2016 | Perreault |
| 9,537,456 | B2 | 1/2017 | Briffa et al. |
| 9,560,740 | B2 | 1/2017 | Kitazaki et al. |
| 9,628,118 | B2 | 4/2017 | Xu et al. |
| 9,634,560 | B2 | 4/2017 | Ek |
| 9,634,577 | B2 | 4/2017 | Perreault |
| 9,729,048 | B2 | 8/2017 | Crandall et al. |
| 9,755,672 | B2 | 9/2017 | Perreault et al. |
| 9,768,731 | B2 | 9/2017 | Perreault et al. |
| 9,768,732 | B2 | 9/2017 | Briffa et al. |
| 9,887,718 | B2 | 2/2018 | Watanabe |
| 9,917,517 | B1 | 3/2018 | Jiang et al. |
| 9,979,421 | B2 | 5/2018 | Astrom et al. |
| 9,991,913 | B1 | 6/2018 | Dinur et al. |
| 10,103,621 | B2 | 10/2018 | Junmin et al. |
| 10,110,169 | B2 | 10/2018 | Khesbak et al. |
| 10,164,577 | B2 | 12/2018 | Briffa et al. |
| 10,193,441 | B2 | 1/2019 | Giuliano |
| 10,274,987 | B2 | 4/2019 | Puggelli et al. |
| 10,291,184 | B1 | 5/2019 | Sutskover et al. |
| 10,348,191 | B2 | 7/2019 | Giuliano |
| 10,381,924 | B2 | 8/2019 | Giuliano |
| 10,389,235 | B2 | 8/2019 | Giuliano |
| 10,396,815 | B1 | 8/2019 | Kuttner |
| 10,476,390 | B2 | 11/2019 | Petersen |
| 10,498,012 | B2 | 12/2019 | Judkins et al. |
| 10,658,981 | B2 | 5/2020 | Briffa et al. |
| 10,666,200 | B2 | 5/2020 | Gebeyehu et al. |
| 10,749,476 | B2 | 8/2020 | Sutskover et al. |
| 10,840,805 | B2 | 11/2020 | Perreault |
| 10,855,228 | B2 | 12/2020 | Eichler et al. |
| 10,862,428 | B2 | 12/2020 | Henzler et al. |
| 10,958,218 | B2 | 3/2021 | Gebeyehu et al. |
| 10,992,265 | B2 | 4/2021 | Hoversten et al. |
| 11,043,918 | B2 | 6/2021 | Tanaka et al. |
| 11,101,228 | B1 | 8/2021 | Kim et al. |
| 11,165,393 | B2 | 11/2021 | Pehlke |
| 11,191,028 | B2 | 11/2021 | Hoversten et al. |
| 11,245,367 | B2 | 2/2022 | Garrett et al. |
| 11,374,491 | B2 | 6/2022 | Lam |
| 11,374,538 | B2 | 6/2022 | Drogi et al. |
| 11,387,789 | B2 | 7/2022 | Khlat et al. |
| 11,387,797 | B2 | 7/2022 | Drogi et al. |
| 11,394,347 | B2 | 7/2022 | Gebeyehu et al. |
| 11,495,521 | B2 | 11/2022 | Ji et al. |
| 11,539,289 | B2 | 12/2022 | Khlat et al. |
| 11,558,014 | B2 | 1/2023 | Tanaka et al. |
| 11,637,531 | B1 | 4/2023 | Perreault et al. |
| 11,652,501 | B2 | 5/2023 | Kim et al. |
| 11,658,691 | B2 | 5/2023 | Shinozaki |
| 11,664,727 | B2 | 5/2023 | Giuliano et al. |
| 11,728,773 | B2 | 8/2023 | Gebeyehu et al. |
| 11,757,411 | B2 | 9/2023 | Tanaka et al. |
| 11,764,669 | B2 | 9/2023 | Chen et al. |
| 12,028,026 | B2 | 7/2024 | Tsuchida et al. |
| 12,052,001 | B2 | 7/2024 | Shinozaki et al. |
| 12,069,580 | B2 | 8/2024 | Hoversten et al. |
| 12,074,620 | B2 | 8/2024 | Shinozaki |
| 12,095,422 | B2 | 9/2024 | Gebeyehu et al. |
| 12,341,431 | B2 | 6/2025 | Jin et al. |
| 2013/0271928 | A1 | 10/2013 | Shimamura et al. |
| 2014/0118063 | A1 | 5/2014 | Briffa et al. |
| 2014/0132354 | A1 | 5/2014 | Briffa et al. |
| 2015/0084701 | A1 | 3/2015 | Perreault et al. |
| 2015/0155895 | A1 | 6/2015 | Perreault et al. |
| 2018/0316311 | A1 | 11/2018 | Gebeyehu et al. |
| 2020/0336108 | A1 | 10/2020 | Gebeyehu et al. |
| 2021/0184632 | A1 | 6/2021 | Gebeyehu et al. |
| 2021/0288614 | A1 | 9/2021 | Hoversten et al. |
| 2022/0094308 | A1 | 3/2022 | Shinozaki et al. |
| 2022/0094373 | A1 | 3/2022 | Tsuchida et al. |
| 2022/0131463 | A1 | 4/2022 | Giuliano et al. |
| 2022/0149725 | A1 | 5/2022 | Garrett et al. |
| 2022/0190849 | A1 | 6/2022 | Shinozaki |
| 2022/0311386 | A1 | 9/2022 | Gebeyehu et al. |
| 2023/0054485 | A1 | 2/2023 | Hoversten et al. |
| 2023/0056740 | A1 | 2/2023 | Perreault et al. |
| 2023/0057037 | A1 | 2/2023 | Hoversten et al. |
| 2023/0253993 | A1 | 8/2023 | Shinozaki |
| 2024/0372571 | A1 | 11/2024 | Shinozaki |

FOREIGN PATENT DOCUMENTS

| | | | | | |
|---|---|---|---|---|---|
| JP | 2015-533066 | A | | 11/2015 | |
| JP | 2017-092291 | A | | 5/2017 | |
| JP | 2020-516194 | A | | 5/2020 | |
| WO | 2015/123267 | A1 | | 8/2015 | |
| WO | 2017/006784 | A1 | | 1/2017 | |
| WO | 2017/196826 | A1 | | 11/2017 | |
| WO | 2021/006020 | A1 | | 1/2021 | |
| WO | WO-2021007299 | A1 | * | 1/2021 | ............ H02M 3/158 |
| WO | 2021/044691 | A1 | | 3/2021 | |

OTHER PUBLICATIONS

International Search Report received for PCT Patent Application No. PCT/JP2022/035968, mailed on Dec. 27, 2022, 2 pages (English Translation only).

Analog.com, "55V, 300W Source/Sink Hybrid Step-Down Non-Isolated µModule Bus Converter", Data Sheet LTM4654, Analog Devices, 2025, pp. 1-48.

Cao, et al.; "A Family of Zero Current Switching Switched-Capacitor DC-DC Converters"; 2010 Twenty-Fifth Annual IEEE Applied Power Electronics Conference and Exposition (APEC); Feb. 21-25, 2010; 8 Pages.

Cao, et al.; "Multiphase Multilevel Modulator DC-DC Converter for High-Current High-Gain TEG Application"; IEEE Transactions on Industry Application; vol. 47; No. 3; May/Jun. 2011; 9 Pages.

Chen, et al; "A High Efficiency High Power Step-Up Resonant Switched-Capacitor"; 2012 IEEE Energy Conversion Congress and Exposition (ECCE); Sep. 15-20, 2012; 5 Pages.

Shoyama, et al.; "Resonant Switched Capacitor Converter with High Efficiency"; 2004 35th Annual IEEE Power Electronics Specialists Conference; 2004; 7 Pages.

Sun, et al.; "High Power Density, High Efficiency System Two-Stage Power Architecture for Laptop Computers"; 2006 37th IEEE

(56) References Cited

OTHER PUBLICATIONS

Power Electronics Specialists Conference; Jun. 18-22, 2006; 7 Pages.

Unknown; "Fundamentals of Power Electronics"; Chapter 19: Resonant Conversion; Sep. 19, 2019; 87 Pages.

Yeung, et al.; "Multiple and Fractional Voltage Conversion Ratios for Switched-capacitor Resonant Converters"; 2001 IEEE 32nd Annual Power Electronics Specialists Conference (IEEE Cat. No. 01CH37230); Jun. 17-21, 2001; 6 Pages.

* cited by examiner

TRACKER MODULE AND COMMUNICATION DEVICE

CROSS REFERENCE TO RELATED APPLICATIONS

This application is a continuation of International Application No. PCT/JP2022/035968, filed Sep. 27, 2022, which claims priority to Japanese Patent Application No. 2021-159619, filed Sep. 29, 2021, the entire contents of each of which are hereby incorporated by reference in their entirety.

TECHNICAL FIELD

The present disclosure relates to a tracker module and a communication device.

BACKGROUND

U.S. Pat. No. 9,755,672 (hereinafter "Patent Document 1") discloses a power supply modulator circuit (e.g., an envelope tracking system) that supplies a power supply voltage to a power amplifier circuit based on an envelope signal. This power supply modulator circuit includes a magnetic converter circuit (Magnetic Regulation Stage) that converts a voltage, a switched-capacitor circuit (Switched-Capacitor Voltage Balancer Stage) that generates multiple voltages having different voltage levels from the converted voltage, and an output switch circuit (Output Switching Stage) that selects and outputs at least one of the multiple voltages. The magnetic converter circuit includes switches and a power inductor. The switched-capacitor circuit includes switches and capacitors. The output switch circuit includes switches.

In the power supply modulator circuit disclosed in Patent Document 1, if the switches of the switched-capacitor circuit and those of the output switch circuit are mounted on a module substrate as the same switch integrated circuit, lines connecting the switches and capacitors of the switched-capacitor circuit become long. However, the lines need to have a low resistance because a high current flows through the lines due to high-speed charging and discharging of the capacitors. But if the lines are long, a resistance loss in the lines increases, which may degrade the output characteristics of the power supply voltage from the power supply modulator circuit.

SUMMARY OF THE INVENTION

In view of the foregoing, the present disclosure provides a tracker module and a communication device that prevents or minimizes the output characteristics of a power supply voltage from degrading.

In an exemplary aspect, a tracker module is provided that includes a module substrate, an integrated circuit disposed on the module substrate, and a capacitor disposed on the module substrate and included in a switched-capacitor circuit. The switched-capacitor circuit is configured to generate a plurality of discrete voltages based on an input voltage. The integrated circuit includes a switch included in the switched-capacitor circuit and a switch included in an output switch circuit. The output switch circuit is configured to selectively output at least one of the discrete voltages based on an envelope voltage. The integrated circuit and the capacitor are disposed adjacent to each other.

In another exemplary aspect, a tracker module is provided that includes a module substrate, a switched-capacitor circuit, and an output switch circuit. The switched-capacitor circuit is configured to generate a plurality of discrete voltages based on an input voltage. The output switch circuit includes an input terminal connected to a control circuit and selectively outputs at least one of the discrete voltages. The switched-capacitor circuit includes a switch and a capacitor. The output switch circuit includes a switch. The switch of the switched-capacitor circuit and the switch of the output switch circuit are included in an integrated circuit. The capacitor and the integrated circuit are disposed on the module substrate. The integrated circuit and the capacitor are disposed adjacent to each other.

In another exemplary aspect, a tracker module is provided that includes a module substrate and first and second circuits. The first circuit includes a first capacitor including first and second electrodes, a second capacitor including third and fourth electrodes, and first, second, third, fourth, fifth, sixth, seventh, and eighth switches. A first end of the first switch and a first end of the third switch are connected to the first electrode. Moreover, a first end of the second switch and a first end of the fourth switch are connected to the second electrode. A first end of the fifth switch and a first end of the seventh switch are connected to the third electrode. A first end of the sixth switch and a first end of the eighth switch are connected to the fourth electrode. The second end of the first switch, the second end of the second switch, the second end of the fifth switch, and the second other end of the sixth switch are connected to each other. Moreover, the second end of the third switch is connected to the second end of the seventh switch. The second end of the fourth switch is connected to the second end of the eighth switch. The second circuit includes a first output terminal and ninth and tenth switches. The ninth switch is connected between the first output terminal and each of the second end of the first switch, the second end of the second switch, the second end of the fifth switch, and the second end of the sixth switch. The tenth switch is connected between the first output terminal and each second end of the third and seventh switch. The first through tenth switches are included in an integrated circuit. The first and second capacitors and the integrated circuit are disposed on the module substrate. Moreover, the integrated circuit and one of the first and second capacitors are adjacent to each other.

According to the present disclosure, a tracker module and a communication device are provided that prevent or minimize the output characteristics of a power supply voltage from degrading.

DETAILED DESCRIPTION

Figure 1:
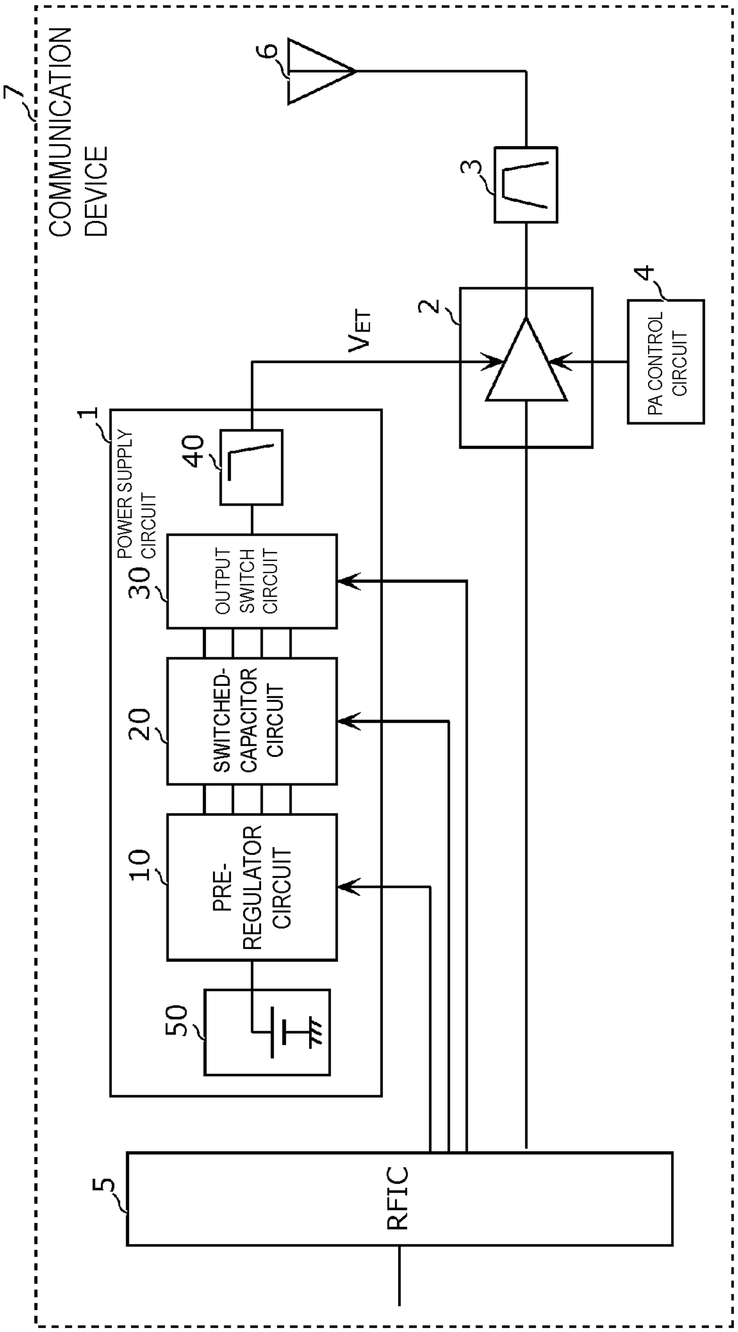
FIG. 1 is a circuit block diagram of a power supply circuit and a communication device according to an exemplary embodiment.

Exemplary embodiments of the present disclosure will be described below in detail with reference to the drawings. All the embodiments described below illustrate general or specific examples. It is noted that Numerical values, configurations, materials, elements, and positions and connection states of the elements, for example, illustrated in the following embodiments are only examples and are not intended to limit the invention.

Moreover, the drawings are only schematically shown and are not necessarily precisely illustrated. For the sake of representation of the exemplary aspects, if necessary, the drawings are illustrated in an exaggerated manner or with omissions or the ratios of elements in the drawings are adjusted. The shapes, positional relationships, and ratios of elements in the drawings may be different from those of the actual elements. In the drawings, substantially identical elements are designated by like reference numeral and an explanation of such elements may be omitted or be merely simplified from the second time.

It is noted that in the individual drawings, the x axis and the y axis are axes which are perpendicular to each other on a plane parallel with the main surfaces of a module substrate. More specifically, in exemplary aspects where the module substrate has a rectangular shape in a plan view, the x axis is parallel with a first side of the module substrate, while the y axis is parallel with a second side, which is perpendicular to the first side, of the module substrate. The z axis is an axis perpendicular to the main surfaces of the module substrate. The positive direction of the z axis is the top direction, while the negative direction of the z axis is the bottom direction.

In the following embodiments and for purposes of this disclosure, the phrase "A is connected to B" includes, not only the meaning that A is directly connected to B using a connection terminal and/or a wiring conductor, but also the meaning that A is electrically connected to B via another circuit element. Moreover, the phrase "an element is connected between A and B" means that the element is connected to both A and B between A and B and includes the meaning that the element is connected in series with a path connecting A and B.

In the layout of components in the exemplary aspect, the phrase "A is disposed on a main surface of a module substrate" includes the meaning that A is directly mounted on this main surface. There is a space close to this main surface and a space close to the opposite main surface with the module substrate interposed therebetween. Moreover, the phrase "a is disposed on a main surface of a module substrate" also includes the meaning that A is disposed in the space close to the above-described main surface, namely, A is mounted on this main surface via another circuit component or electrode.

In the layout of components in the exemplary aspect, the phrase "in a plan view" means that an object is orthographically projected on an xy plane from the positive side of the z axis and is viewed from this side.

In the layout of components in the exemplary aspect, the phrase "A and B are adjacent to each other" means that A and B are disposed close to each other, and more specifically, no circuit component is disposed in a space between A and B. In other words, none of multiple line segments from a certain point on a surface of A facing B until B along a direction normal to this surface passes through circuit components other than A and B. The circuit components include active components, such as transistors and diodes, and passive components, such as inductors, transformers, capacitors, and resistors, and do not include terminals, connectors, electrodes, wiring, and resin members.

In the present disclosure, terms representing the relationship between elements, such as "being parallel" and "being vertical", and terms representing the shape of an element, such as "being rectangular", are not necessarily to be interpreted in an exact sense, but to be interpreted in a broad sense. That is, such terms also cover substantially equivalent ranges, such as about several percent of allowance.

In the present disclosure, the term "signal path" means a transmission line formed by elements, such as a line for transferring a radio-frequency signal therethrough, an electrode directly connected to this line, and a terminal directly connected to this line or this electrode.

Exemplary Embodiments

1 Circuit Configurations of Power Supply Circuit 1 and Communication Device 7

The circuit configurations of a power supply circuit 1 and a communication device 7 according to an embodiment will be described below with reference to FIG. 1. FIG. 1 is a circuit block diagram of the power supply circuit 1 and the communication device 7 according to the embodiment.

[1.1 Circuit Configuration of Communication Device 7]

The circuit configuration of the communication device 7 will first be described below. As illustrated in FIG. 1, the communication device 7 according to the embodiment includes a power supply circuit 1, a power amplifier circuit 2, a filter 3, a PA control circuit 4, an RFIC (Radio Frequency Integrated Circuit) 5, and an antenna 6.

The power supply circuit 1 includes a pre-regulator circuit 10, a switched-capacitor circuit 20, an output switch circuit 30, a filter circuit 40, and a direct current (DC) power source 50.

The power supply circuit 1 is configured to supply a power supply voltage $V_{ET}$ having a power supply voltage level, which is selected from multiple discrete voltage levels based on an envelope signal, to the power amplifier circuit 2. In FIG. 1, the power supply circuit 1 supplies one power supply voltage $V_{ET}$ to one power amplifier circuit 2. However, the power supply circuit 1 may individually supply power supply voltages to plural power amplifiers.

The pre-regulator circuit 10 is an example of a third circuit and includes a power inductor and switches. The power inductor is an inductor used for stepping-up and/or stepping-down a DC voltage. The power inductor is disposed in series with a DC path. The pre-regulator circuit 10 is configured to convert an input voltage (third voltage) into a first voltage by using the power inductor. The pre-regulator circuit 10 configured as described above may also be called a magnetic regulator or a DC (Direct Current)-to-DC converter. The power inductor may be connected between the DC path and a ground. In other words, the power inductor may be connected in parallel with the DC path.

The provision of a power inductor for the pre-regulator circuit 10 may be omitted. For example, the pre-regulator circuit 10 may be a circuit that steps-up a voltage by switching a capacitor disposed on a series arm path and a capacitor disposed on a parallel arm path of the pre-regulator circuit 10.

The switched-capacitor circuit 20 is an example of a first circuit. The switched-capacitor circuit 20 includes plural capacitors and plural switches and is configured to generate multiple discrete second voltages having the respective discrete voltage levels from the first voltage supplied from the pre-regulator circuit 10. The switched-capacitor circuit 20 may also be called a switched-capacitor voltage balancer.

The output switch circuit 30 is an example of a second circuit. Based on a digital control signal corresponding to an envelope signal, the output switch circuit 30 is configured to selectively output at least one of the multiple discrete voltages (multiple second voltages) generated by the switched-capacitor circuit 20 to the filter circuit 40. As a result, at least one voltage selected from the multiple discrete voltages is output from the output switch circuit 30. In this manner, the output switch circuit 30 repeatedly selects a voltage over time so as to change the output voltage over time.

In an exemplary aspect, the output switch circuit 30 includes various circuit elements and/or lines that cause a voltage drop and/or noise, for example. Hence, the time waveform of the output voltage from the output switch circuit 30 is not necessarily a rectangular wave including only multiple discrete voltages. That is, the output voltage from the output switch circuit 30 can include a voltage, which is none of the multiple discrete voltages.

The filter circuit 40 is an example of a fourth circuit and is configured to filter signals (second voltages) received from the output switch circuit 30. The filter circuit 40 is formed by a low pass filter (LPF), for example.

The DC power source 50 can supply a DC voltage to the pre-regulator circuit 10. As the DC power source 50, a rechargeable battery, for example, may be used, but the DC power source 50 is not limited to this configuration in alternative aspects.

The provision of at least one of the pre-regulator circuit 10, filter circuit 40, and DC power source 50 for the power supply circuit 1 may be omitted. For example, the provision of the filter circuit 40 and the DC power source 50 for the power supply circuit 1 may be omitted. A desired combination of the pre-regulator circuit 10, switched-capacitor circuit 20, output switch circuit 30, and filter circuit 40 may be integrated into a single circuit. An example of the detailed circuit configuration of the power supply circuit 1 will be discussed later with reference to FIG. 3.

The power amplifier circuit 2 is connected between the RFIC 5 and the filter 3. The power amplifier circuit 2 amplifies a radio-frequency transmission signal (hereinafter called a "transmission signal") of a predetermined band output from the RFIC 5 and outputs the amplified transmission signal to the antenna 6 via the filter 3.

In response to a control signal received from the RFIC 5, the PA control circuit 4 controls the magnitude and the supply timing of a bias current (or a bias voltage) to be supplied to the power amplifier circuit 2.

The filter 3 is connected between the power amplifier circuit 2 and the antenna 6. The filter 3 has a pass band including a predetermined band so as to allow a transmission signal of the predetermined band amplified by the power amplifier circuit 2 to pass through the filter 3.

The antenna 6 is connected to the output side of the power amplifier circuit 2 and transmits a transmission signal of the predetermined band output from the power amplifier circuit 2.

The RFIC 5 is an example of a signal processing circuit that processes a radio-frequency signal. More specifically, the RFIC 5 performs signal processing, such as up-conversion, on a transmission signal received from a BBIC (baseband signal processing circuit: not shown) and outputs the resulting transmission signal to the power amplifier circuit 2.

The RFIC 5 is also an example of a control circuit and includes a controller that controls the power supply circuit 1 and the power amplifier circuit 2. Based on the envelope signal of a radio-frequency input signal obtained from the BBIC, the RFIC 5 causes the output switch circuit 30 to select the voltage level of the power supply voltage $V_{ET}$ to be used in the power amplifier circuit 2 from among multiple discrete voltage levels generated in the switched-capacitor circuit 20. With this configuration, the power supply circuit 1 outputs the power supply voltage $V_{ET}$ based on digital envelope tracking.

All or some of the functions of the RFIC 5 as the controller may be disposed outside the RFIC 5, such as in the BBIC or the power supply circuit 1. For example, a control function of selecting the above-described power supply voltage $V_{ET}$ may be included in the power supply circuit 1 instead of the RFIC 5.

The envelope signal is a signal indicating the envelope of a radio-frequency input signal (modulated signal). The envelope value is represented by $\sqrt{(i^2+Q^2)}$, for example. (I, Q) is a constellation point. The constellation point is a point of a digital modulated signal on a constellation diagram. (I, Q) is determined by the BBIC based on transmission information, for example.

Tracking the envelope of a radio-frequency signal by the use of multiple discrete voltage levels within a frame will be called digital envelope tracking (hereinafter called "digital ET"), and a mode in which digital ET is applied to a power supply voltage will be called a digital ET mode. Tracking the envelope of a radio-frequency signal by the use of continuous voltage levels will be called analog envelope tracking (hereinafter called "analog ET"), and a mode in which analog ET is applied to a power supply voltage will be called an analog ET mode.

For purposed of this disclosure, a frame is a unit that forms a radio-frequency signal (e.g., modulated signal). For example, 5GNR (5th Generation New Radio) and LTE (Long Term Evolution) define that a frame includes ten subframes, each subframe includes plural slots, and each slot is formed by plural symbols. The subframe length is 1 ms, and the frame length is 10 ms.

The digital ET mode and the analog ET mode will be explained below with reference to FIGS. 2A and 2B.

Figure 2A:
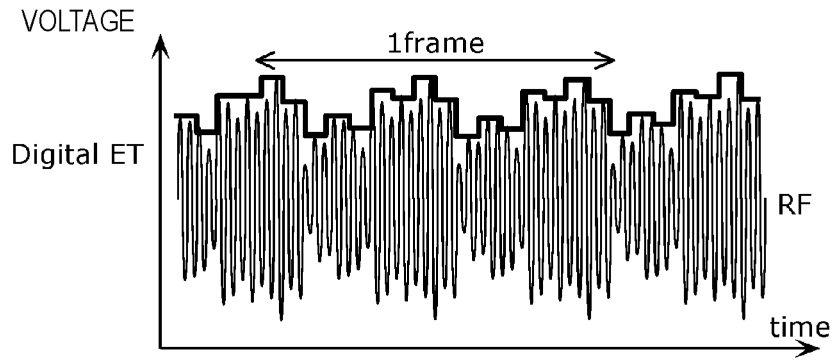
FIG. 2A is a graph illustrating an example of the transition of a power supply voltage in a digital ET mode.

FIG. 2A is a graph illustrating an example of the transition of a power supply voltage in the digital ET mode. FIG. 2B is a graph illustrating an example of the transition of a power supply voltage in the analog ET mode. In FIGS. 2A and 2B, the horizontal axis indicates the time, and the vertical axis indicates the voltage. The thick solid line represents the power supply voltage $V_{ET}$, while the thin solid line (waveform) represents a modulated signal.

In the digital ET mode, as shown in FIG. 2A, the power supply voltage $V_{ET}$ is varied to multiple discrete voltage levels within one frame so as to track the envelope of the modulated signal. As a result, the power supply voltage signal forms a rectangular wave. In the digital ET mode, based on an envelope signal ($\sqrt{(i^2+Q^2)}$), the power supply voltage level is selected from among multiple discrete voltage levels.

Figure 2B:
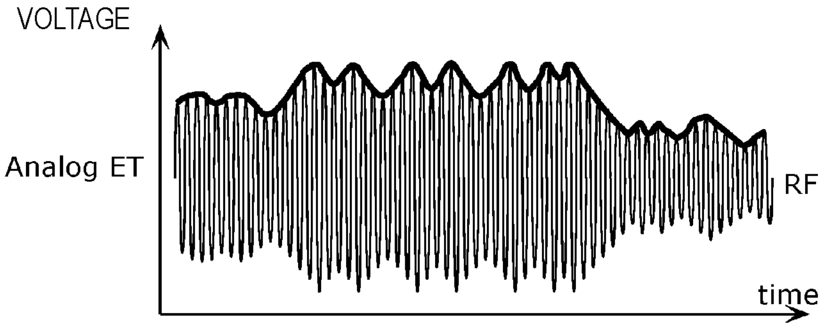
FIG. 2B is a graph illustrating an example of the transition of a power supply voltage in an analog ET mode.

In the analog ET mode, as shown in FIG. 2B, the power supply voltage $V_{ET}$ is continuously varied so as to track the envelope of the modulated signal. In the analog ET mode, the power supply voltage $V_{ET}$ is determined based on an envelope signal. In the analog ET mode, when the channel bandwidth is relatively small (lower than 60 MHz, for example), the power supply voltage $V_{ET}$ can follow a change in the envelope of a modulated signal, but when the channel bandwidth is relatively large (60 MHz or higher, for example), the power supply voltage $V_{ET}$ is unable to follow a change in the envelope of a modulated signal. In other words, when the channel bandwidth is relatively large, the amplitude change of the power supply voltage $V_{ET}$ tends to delay with respect to a change in the envelope of a modulated signal.

In contrast, when the channel bandwidth is relatively large (60 MHz or higher, for example), with the application of the digital ET mode, the followability of the power supply voltage $V_{ET}$ to the modulated signal is improved, as shown in FIG. 2A.

It is noted that the communication device 7 shown in FIG. 1 is only an example and the communication device 7 is not limited to the configuration shown in FIG. 1. In one example, the provision of the filter 3, PA control circuit 4, and antenna 6 for the communication device 7 may be omitted. In another example, the communication device 7 may have a receive path including a low-noise amplifier and a receive filter. In another example, the communication device 7 may include plural power amplifier circuits corresponding to different bands.

[1.2 Circuit Configuration of Power Supply Circuit 1]

Figure 3:
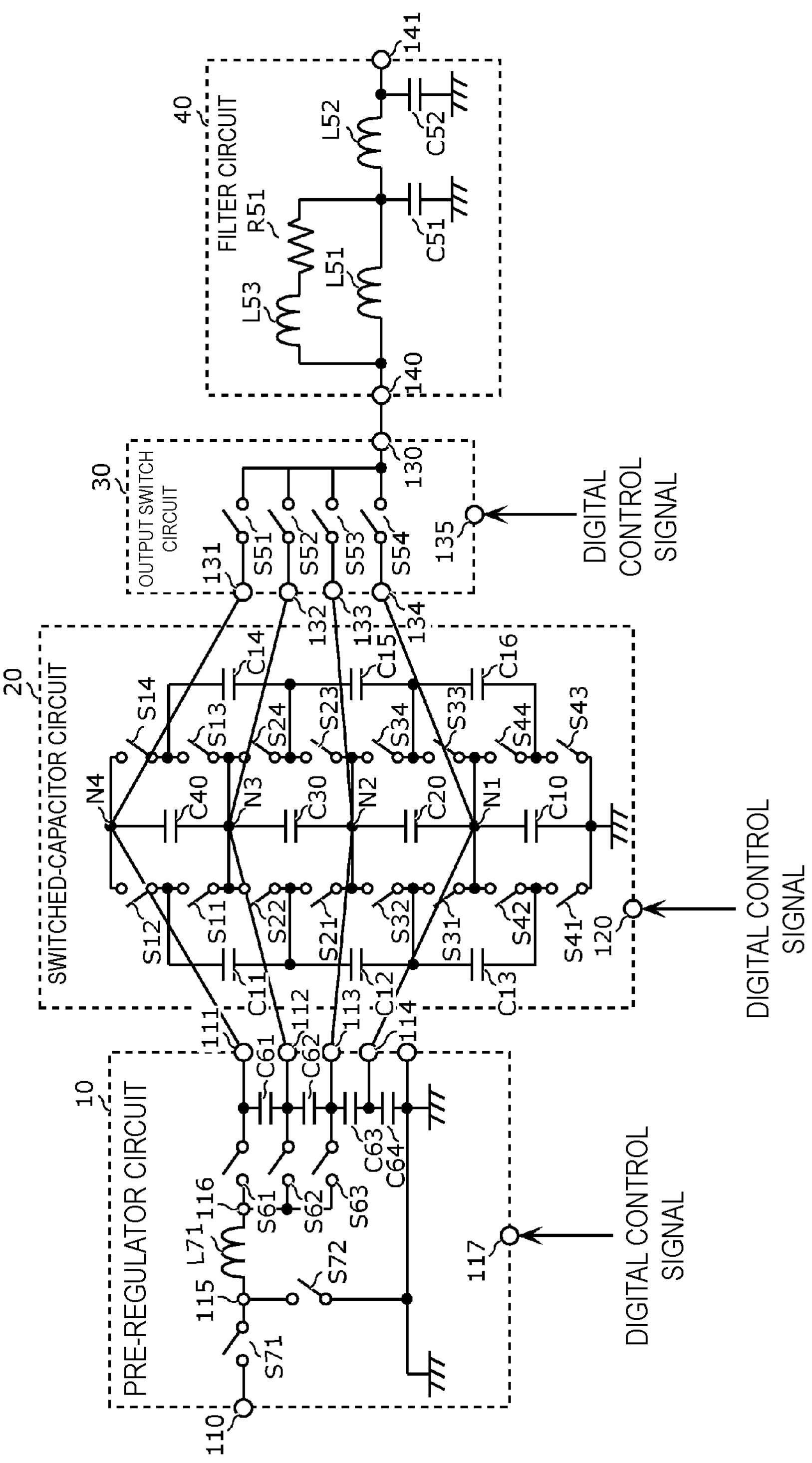
FIG. 3 illustrates an example of the circuit configuration of the power supply circuit according to the exemplary embodiment.

The circuit configurations of the pre-regulator circuit 10, switched-capacitor circuit 20, output switch circuit 30, and filter circuit 40 included in the power supply circuit 1 will now be described below with reference to FIG. 3. FIG. 3 illustrates an example of the circuit configuration of the power supply circuit 1 according to the embodiment.

The circuit configuration shown in FIG. 3 is only an example, and the pre-regulator circuit 10, switched-capacitor circuit 20, output switch circuit 30, and filter circuit 40 can be implemented by using any of a variety of circuit implementations and circuit technologies. Hence, the following explanations of the pre-regulator circuit 10, switched-capacitor circuit 20, output switch circuit 30, and filter circuit 40 are not to be interpreted in a limited manner.

[1.2.1 Circuit Configuration of Switched-Capacitor Circuit 20]

The circuit configuration of the switched-capacitor circuit 20 will first be discussed below. As illustrated in FIG. 3, the switched-capacitor circuit 20 includes capacitors C11, C12, C13, C14, C15, C16, capacitors C10, C20, C30, and C40, and switches S11, S12, S13, S14, S21, S22, S23, S24, S31, S32, S33, S34, S41, S42, S43, and S44, and a control terminal 120.

The control terminal 120 is an input terminal for a digital control signal. That is, the control terminal 120 is a terminal for receiving a digital control signal for controlling the switched-capacitor circuit 20. As the digital control signal to be received via the control terminal 120, a control signal based on a source synchronous system to transmit a data signal and a clock signal, for example, may be used. However, another system may be used. For instance, a clock-in-embedded system may be used for the digital control signal in an alternative aspect.

The capacitors C11 through C16 each serve as a flying capacitor (may also be called a transfer capacitor). That is, each of the capacitors C11 through C16 is used for stepping up or stepping down the first voltage supplied from the pre-regulator circuit 10. More specifically, the capacitors C11 through C16 transfer electric charge between the capacitors C11 through C16 and nodes N1 through N4 so that voltages V1 through V4 (voltages with respect to a ground potential) which satisfy the relationship of V1:V2:V3:V4=1:2:3:4 can be maintained at the nodes N1 through N4, respectively. The voltages V1 through V4 correspond to multiple discrete second voltages having the respective discrete voltage levels.

The capacitor C11 has two electrodes. One of the two electrodes of the capacitor C11 is connected to one end of the switch S11 and one end of the switch S12. The other one of the two electrodes of the capacitor C11 is connected to one end of the switch S21 and one end of the switch S22. For purposes of this disclosure the term "one end" may generally be considered a "first end" and the term "another end" or the "other end" may generally be considered a "second end". These terms for such components may be interchangeable as would be appreciated to one skilled in the art.

The capacitor C12 is an example of a first capacitor and has two electrodes (an example of a first electrode and a second electrode). One of the two electrodes of the capacitor C12 is connected to one end of the switch S21 and one end of the switch S22. The other one of the two electrodes of the capacitor C12 is connected to one end of the switch S31 and one end of the switch S32.

The capacitor C13 has two electrodes. One of the two electrodes of the capacitor C13 is connected to one end of the switch S31 and one end of the switch S32. The other one of the two electrodes of the capacitor C13 is connected to one end of the switch S41 and one end of the switch S42.

The capacitor C14 has two electrodes. One of the two electrodes of the capacitor C14 is connected to one end of the switch S13 and one end of the switch S14. The other one of the two electrodes of the capacitor C14 is connected to one end of the switch S23 and one end of the switch S24.

The capacitor C15 is an example of a second capacitor and has two electrodes (an example of a third electrode and a fourth electrode). One of the two electrodes of the capacitor C15 is connected to one end of the switch S23 and one end of the switch S24. The other one of the two electrodes of the capacitor C15 is connected to one end of the switch S33 and one end of the switch S34.

The capacitor C16 has two electrodes. One of the two electrodes of the capacitor C16 is connected to one end of the switch S33 and one end of the switch S34. The other one of the two electrodes of the capacitor C16 is connected to one end of the switch S43 and one end of the switch S44.

The capacitors C11 and C13 are also examples of the first capacitor. The capacitors C14 and C16 are also examples of the second capacitor.

As a result of repeating a first phase and a second phase, a set of the capacitors C11 and C14, a set of the capacitors C12 and C15, and a set of the capacitors C13 and C16 can each complementarily perform charging and discharging.

More specifically, in the first phase, the switches S12, S13, S22, S23, S32, S33, S42, and S43 are ON. As a result, for example, one of the two electrodes of the capacitor C12 is connected to the node N3, the other one of the two electrodes of the capacitor C12 and one of the two electrodes of the capacitor C15 are connected to the node N2, and the other one of the two electrodes of the capacitor C15 is connected to the node N1.

In the second phase, the switches S11, S14, S21, S24, S31, S34, S41, and S44 are ON. As a result, for example, one of the two electrodes of the capacitor C15 is connected to the node N3, the other one of the two electrodes of the capacitor C15 and one of the two electrodes of the capacitor C12 are connected to the node N2, and the other one of the two electrodes of the capacitor C12 is connected to the node N1.

As a result of repeating the first phase and the second phase, when, for example, one of the capacitors C12 and C15 is being charged from the node N2, the other one of the capacitors C12 and C15 can discharge to the capacitor C30. That is, the capacitors C12 and C15 can complementarily perform charging and discharging. The capacitors C12 and C15 are a pair of flying capacitors that complementarily perform charging and discharging.

As in the set of the capacitors C12 and C15, as a result of suitably switching the switches, a set of one of the capacitors C11, C12, and C13 (e.g., a first capacitor) and one of the capacitors C14, C15, and C16 (e.g., a second capacitor) also serves as a pair of flying capacitors that complementarily perform charging from a corresponding node and discharging to a smoothing capacitor.

The capacitors C10, C20, C30, and C40 each serve as a smoothing capacitor. That is, the capacitors C10, C20, C30, and C40 are respectively used for holding and smoothing the voltages V1 through V4 at the nodes N1 through N4.

The capacitor C10 is an example of a third capacitor and is connected between the node N1 and a ground. More specifically, one (fifth electrode) of two electrodes of the capacitor C10 is connected to the node N1, while the other one (sixth electrode) of the two electrodes of the capacitor C10 is connected to a ground.

The capacitor C20 is connected between the nodes N2 and N1. More specifically, one of two electrodes of the capacitor C20 is connected to the node N2, while the other one of the two electrodes of the capacitor C20 is connected to the node N1.

The capacitor C30 is connected between the nodes N3 and N2. More specifically, one of two electrodes of the capacitor C30 is connected to the node N3, while the other one of the two electrodes of the capacitor C30 is connected to the node N2.

The capacitor C40 is connected between the nodes N4 and N3. More specifically, one of two electrodes of the capacitor C40 is connected to the node N4, while the other one of the two electrodes of the capacitor C40 is connected to the node N3.

The switch S11 is connected between one of the two electrodes of the capacitor C11 and the node N3. More specifically, one end of the switch S11 is connected to one of the two electrodes of the capacitor C11, while the other end of the switch S11 is connected to the node N3.

The switch S12 is connected between one of the two electrodes of the capacitor C11 and the node N4. More specifically, one end of the switch S12 is connected to one of the two electrodes of the capacitor C11, while the other end of the switch S12 is connected to the node N4.

The switch S21 is an example of a first switch and is connected between one of the two electrodes of the capacitor C12 and the node N2. More specifically, one end of the switch S21 is connected to one of the two electrodes of the capacitor C12 and the other one of the two electrodes of the capacitor C11, while the other end of the switch S21 is connected to the node N2.

The switch S22 is an example of a third switch and is connected between one of the two electrodes of the capacitor C12 and the node N3. More specifically, one end of the switch S22 is connected to one of the two electrodes of the capacitor C12 and the other one of the two electrodes of the capacitor C11, while the other end of the switch S22 is connected to the node N3.

The switch S31 is an example of a fourth switch and is connected between the other one of the two electrodes of the capacitor C12 and the node N1. More specifically, one end of the switch S31 is connected to the other one of the two electrodes of the capacitor C12 and one of the two electrodes of the capacitor C13, while the other end of the switch S31 is connected to the node N1.

The switch S32 is an example of a second switch and is connected between the other one of the two electrodes of the capacitor C12 and the node N2. More specifically, one end of the switch S32 is connected to the other one of the two electrodes of the capacitor C12 and one of the two electrodes of the capacitor C13, while the other end of the switch S32 is connected to the node N2. That is, the other end of the switch S32 is connected to the other end of the switch S21.

The switch S41 is connected between the other one of the two electrodes of the capacitor C13 and a ground. More specifically, one end of the switch S41 is connected to the other one of the two electrodes of the capacitor C13, while the other end of the switch S41 is connected to a ground.

The switch S42 is connected between the other one of the two electrodes of the capacitor C13 and the node N1. More specifically, one end of the switch S42 is connected to the other one of the two electrodes of the capacitor C13, while the other end of the switch S42 is connected to the node N1. That is, the other end of the switch S42 is connected to the other end of the switch S31.

The switch S13 is connected between one of the two electrodes of the capacitor C14 and the node N3. More specifically, one end of the switch S13 is connected to one of the two electrodes of the capacitor C14, while the other end of the switch S13 is connected to the node N3. That is, the other end of the switch S13 is connected to the other end of the switch S11 and the other end of the switch S22.

The switch S14 is connected between one of the two electrodes of the capacitor C14 and the node N4. More specifically, one end of the switch S14 is connected to one of the two electrodes of the capacitor C14, while the other end of the switch S14 is connected to the node N4. That is, the other end of the switch S14 is connected to the other end of the switch S12.

The switch S23 is an example of a fifth switch and is connected between one of the two electrodes of the capacitor C15 and the node N2. More specifically, one end of the switch S23 is connected to one of the two electrodes of the capacitor C15 and the other one of the two electrodes of the capacitor C14, while the other end of the switch S23 is connected to the node N2. That is, the other end of the switch S23 is connected to the other end of the switch S21 and the other end of the switch S32.

The switch S24 is an example of a seventh switch and is connected between one of the two electrodes of the capacitor C15 and the node N3. More specifically, one end of the switch S24 is connected to one of the two electrodes of the capacitor C15 and the other one of the two electrodes of the capacitor C14, while the other end of the switch S24 is connected to the node N3. That is, the other end of the switch S24 is connected to the other end of the switch S11, the other end of the switch S22, and the other end of the switch S13.

The switch S33 is an example of an eighth switch and is connected between the other one of the two electrodes of the capacitor C15 and the node N1. More specifically, one end of the switch S33 is connected to the other one of the two electrodes of the capacitor C15 and one of the two electrodes of the capacitor C16, while the other end of the switch S33 is connected to the node N1. That is, the other end of the switch S33 is connected to the other end of the switch S31 and the other end of the switch S42.

The switch S34 is an example of a sixth switch and is connected between the other one of the two electrodes of the capacitor C15 and the node N2. More specifically, one end of the switch S34 is connected to the other one of the two electrodes of the capacitor C15 and one of the two electrodes of the capacitor C16, while the other end of the switch S34 is connected to the node N2. That is, the other end of the switch S34 is connected to the other end of the switch S21, the other end of the switch S32, and the other end of the switch S23.

The switch S43 is connected between the other one of the two electrodes of the capacitor C16 and a ground. More specifically, one end of the switch S43 is connected to the other one of the two electrodes of the capacitor C16, while the other end of the switch S43 is connected to a ground.

The switch S44 is connected between the other one of the two electrodes of the capacitor C16 and the node N1. More specifically, one end of the switch S44 is connected to the other one of the two electrodes of the capacitor C16, while the other end of the switch S44 is connected to the node N1. That is, the other end of the switch S44 is connected to the other end of the switch S31, the other end of the switch S42, and the other end of the switch S33.

The ON/OFF state of a first set of switches including the switches S12, S13, S22, S23, S32, S33, S42, and S43 and the ON/OFF state of a second set of switches including the switches S11, S14, S21, S24, S31, S34, S41, and S44 are switched therebetween in a complementary manner. More specifically, in the first phase, the switches included in the first set are ON, while the switches included in the second set are OFF. Conversely, in the second phase, the switches included in the first set are OFF, while the switches included in the second set are ON.

For example, in one of the first phase and the second phase, the capacitors C11 through C13 charge the capacitors C10 through C40, and in the other one of the first phase and the second phase, the capacitors C14 through C16 charge the capacitors C10 through C40. That is, the capacitors C10 through C40 are constantly charged from the capacitors C11 through C13 or from the capacitors C14 through C16. Hence, even if a current flows from the nodes N1 through N4 to the output switch circuit 30 at high speed, the nodes N1 through N4 are recharged quickly, thereby reducing potential variations at the nodes N1 through N4.

According to the exemplary aspect, the switched-capacitor circuit 20 is operated in this manner so as to maintain a substantially equal voltage across each of the capacitors C10, C20, C30, and C40. More specifically, at the nodes N1 through N4 labeled with V1 through V4, respectively, the voltages V1 through V4 (voltages with respect to a ground potential) which satisfy the relationship of V1:V2:V3:V4=1:2:3:4 can be maintained. The voltage levels of the voltages V1 through V4 correspond to the voltage levels of multiple discrete voltages that are supplied from the switched-capacitor circuit 20 to the output switch circuit 30.

It is noted that the voltage ratio V1:V2:V3:V4 is not limited to 1:2:3:4. For example, the voltage ratio V1:V2:V3:V4 may be 1:2:4:8 in alternative aspects.

It is also noted that the configuration of the switched-capacitor circuit 20 is not limited to that shown in FIG. 3, which illustrates only an example of the configuration of the switched-capacitor circuit 20. Although the switched-capacitor circuit 20 shown in FIG. 3 is configured to supply voltages of four discrete voltage levels, the number of discrete voltage levels is not limited to four. The switched-capacitor circuit 20 may be configured to supply voltages of any number of multiple (two or more) discrete voltage levels. For example, when the switched-capacitor circuit 20 is configured to supply voltages of two discrete voltage levels, it may include at least the capacitors C12 and C15 and switches S21, S22, S31, S32, S23, S24, S33, and S34.

[1.2.2 Circuit Configuration of Output Switch Circuit 30]

The circuit configuration of the output switch circuit 30 will now be described below. As illustrated in FIG. 3, the output switch circuit 30 includes input terminals 131 through 134, switches S51, S52, S53, and S54, an output terminal 130, and a control terminal 135.

The output terminal 130 is connected to the filter circuit 40. The output terminal 130 is a terminal for supplying, as the power supply voltage $V_{ET}$, at least one voltage selected from among the voltages V1 through V4 to the power amplifier circuit 2 via the filter circuit 40. As stated above, the output switch circuit 30 can include various circuit elements and/or lines that cause a voltage drop and/or noise, for example. Thus, the output voltage $V_{ET}$ found at the output terminal 130 can include a voltage, which is none of the voltages V1 through V4.

The input terminals 131 through 134 are connected to the nodes N4 through N1, respectively, of the switched-capacitor circuit 20. The input terminals 131 through 134 are terminals for receiving the voltages V4 through V1, respectively, from the switched-capacitor circuit 20.

The control terminal 135 is an input terminal for a digital control signal. That is, the control terminal 135 is a terminal for receiving a digital control signal indicating one of the voltages V1 through V4. The output switch circuit 30 controls the ON/OFF states of the switches 51 through 54 so as to select the voltage level indicated by the digital control signal.

As the digital control signal received via the control terminal 135, two digital control line/logic (DCL) signals can be used. Each of the DCL signals is a one-bit signal. Each of the voltages V1 through V4 is represented by a combination of two one-bit signals. For example, V1, V2, V3, and V4 are represented by "00", "01", "10", and "11", respectively. For the representation of the voltage level, Gray code may be used. In this case, two control terminals are used for receiving two DCL signals. As the number of DCL signals, any desired number (one or more) of DCL signals may be used in accordance with the number of voltage levels. The DCL signals may be multibit (two or more) signals. According to an exemplary aspect, the digital control signal can be formed by one or more DCL signals. Moreover, a control signal based on the source synchronous system can be used as the digital control signal.

The switch S51 is connected between the input terminal 131 and the output terminal 130. More specifically, the switch S51 has a terminal connected to the input terminal 131 and a terminal connected to the output terminal 130. With this connection configuration, the switch S51 can switch its ON/OFF state so as to selectively connect the input terminal 131 to the output terminal 130 or disconnect the input terminal 131 from the output terminal 130.

The switch S52 is an example of a tenth switch and is connected between the input terminal 132 and the output terminal 130. More specifically, the switch S52 has a terminal connected to the input terminal 132 and a terminal connected to the output terminal 130. With this connection configuration, the switch S52 can switch its ON/OFF state so as to selectively connect the input terminal 132 to the output terminal 130 or disconnect the input terminal 132 from the output terminal 130.

The switch S53 is an example of a ninth switch and is connected between the input terminal 133 and the output terminal 130. More specifically, the switch S53 has a terminal connected to the input terminal 133 and a terminal connected to the output terminal 130. With this connection configuration, the switch S53 can switch its ON/OFF state so as to selectively connect the input terminal 133 to the output terminal 130 or disconnect the input terminal 133 from the output terminal 130.

The switch S54 is connected between the input terminal 134 and the output terminal 130. More specifically, the switch S54 has a terminal connected to the input terminal 134 and a terminal connected to the output terminal 130. With this connection configuration, the switch S54 can switch its ON/OFF state so as to selectively connect the input terminal 134 to the output terminal 130 or disconnect the input terminal 134 from the output terminal 130.

The switches S51 through S54 are controlled to be ON mutually exclusively. That is, only one of the switches S51 through S54 is turned ON, while the remaining switches are turned OFF. This enables the output switch circuit 30 to output one voltage selected from the voltages V1 through V4.

The configuration of the output switch circuit 30 is not limited to that shown in FIG. 3, which illustrates only an example of the configuration of the output switch circuit 30. Among others, the switches S51 through S54 may be configured in any manner if they can selectively connect one of the four input terminals 131 through 134 to the output terminal 130. In one example, the output switch circuit 30 may include another switch between a set of the switches S51 through S53 and a group of the switch S54 and the output terminal 130. In another example, the output switch circuit 30 may include another switch between a set of the switches S51 and S52 and a group of the switches S53 and S54 and the output terminal 130.

In another example, if the output switch circuit 30 is configured to select one of the second voltages having two discrete voltage levels, it may include at least the switches S52 and S53.

In another example, the output switch circuit 30 can be configured to output two or more voltages. In this case, the output switch circuit 30 includes a required number of additional sets of switches similar to the set of switches S51 through S54 and a required number of additional output terminals.

[1.2.3 Circuit Configuration of Pre-Regulator Circuit 10]

The circuit configuration of the pre-regulator circuit 10 will now be described below. As illustrated in FIG. 3, the pre-regulator circuit 10 includes an input terminal 110, output terminals 111 through 114, inductor connection terminals 115 and 116, a control terminal 117, switches S61, S62, S63, S71, and S72, a power inductor L71, and capacitors C61, C62, C63, and C64.

The input terminal 110 is an example of a third input terminal and is an input terminal for a DC voltage. That is, the input terminal 110 is a terminal for receiving an input voltage from the DC power source 50.

The output terminal 111 is an output terminal for the voltage V4. That is, the output terminal 111 is a terminal for supplying the voltage V4 to the switched-capacitor circuit 20. The output terminal 111 is connected to the node N4 of the switched-capacitor circuit 20.

The output terminal 112 is an output terminal for the voltage V3. That is, the output terminal 112 is a terminal for supplying the voltage V3 to the switched-capacitor circuit 20. The output terminal 112 is connected to the node N3 of the switched-capacitor circuit 20.

The output terminal 113 is an output terminal for the voltage V2. That is, the output terminal 113 is a terminal for supplying the voltage V2 to the switched-capacitor circuit 20. The output terminal 113 is connected to the node N2 of the switched-capacitor circuit 20.

The output terminal 114 is an output terminal for the voltage V1. That is, the output terminal 114 is a terminal for supplying the voltage V1 to the switched-capacitor circuit 20. The output terminal 114 is connected to the node N1 of the switched-capacitor circuit 20.

The inductor connection terminal 115 is connected to one terminal of the power inductor L71. The inductor connection terminal 116 is connected to the other terminal of the power inductor L71.

The control terminal 117 is an input terminal for a digital control signal. That is, the control terminal 117 is a terminal for receiving a digital control signal for controlling the pre-regulator circuit 10.

The switch S71 is an example of an eleventh switch and is connected between the input terminal 110 and one end of the power inductor L71. More specifically, the switch S71 has a terminal connected to the input terminal 110 and a terminal connected to one end of the power inductor L71 via the inductor connection terminal 115. With this connection configuration, the switch S71 can switch its ON/OFF state so as to selectively connect the input terminal 110 to one end of the power inductor L71 or disconnect the input terminal 110 from this end of the power inductor L71.

The switch S72 is an example of a twelfth switch and is connected between one end of the power inductor L71 and a ground. More specifically, the switch S72 has a terminal connected to one end of the power inductor L71 via the inductor connection terminal 115 and a terminal connected to a ground. With this connection configuration, the switch S72 can switch its ON/OFF state so as to selectively connect one end of the power inductor L71 to a ground or disconnect this end of the power inductor L71 from the ground.

The switch S61 is connected between the other end of the power inductor L71 and the output terminal 111. More specifically, the switch S61 has a terminal connected to the other end of the power inductor L71 and a terminal connected to the output terminal 111. With this connection configuration, the switch S61 can switch its ON/OFF state so as to selectively connect the other end of the power inductor L71 to the output terminal 111 or disconnect the other end of the power inductor L71 from the output terminal 111.

The switch S62 is connected between the other end of the power inductor L71 and the output terminal 112. More specifically, the switch S62 has a terminal connected to the other end of the power inductor L71 and a terminal connected to the output terminal 112. With this connection configuration, the switch S62 can switch its ON/OFF state so as to selectively connect the other end of the power inductor L71 to the output terminal 112 or disconnect the other end of the power inductor L71 from the output terminal 112.

The switch S63 is connected between the other end of the power inductor L71 and the output terminal 113. More specifically, the switch S63 has a terminal connected to the other end of the power inductor L71 and a terminal connected to the output terminal 113. With this connection configuration, the switch S63 can switch its ON/OFF state so as to selectively connect the other end of the power inductor L71 to the output terminal 113 or disconnect the other end of the power inductor L71 from the output terminal 113.

The capacitor C61 is connected between the output terminals 111 and 112. One of two electrodes of the capacitor C61 is connected to the switch S61 and the output terminal 111. The other one of the two electrodes of the capacitor C61 is connected to the switch S62, the output terminal 112, and one of two electrodes of the capacitor C62.

The capacitor C62 is connected between the output terminals 112 and 113. One of the two electrodes of the capacitor C62 is connected to the switch S62, the output terminal 112, and the other one of the two electrodes of the capacitor C61. The other one of the two electrodes of the capacitor C62 is connected to a path connecting the switch S63, the output terminal 113, and one of two electrodes of the capacitor C63.

The capacitor C63 is an example of a fourth capacitor and is connected between the output terminals 113 and 114. One of the two electrodes of the capacitor C63 is connected to the switch S63, the output terminal 113, and the other one of the two electrodes of the capacitor C62. The other one of the two electrodes of the capacitor C63 is connected to the output terminal 114 and one of two electrodes of the capacitor C64.

The capacitor C64 is connected between the output terminal 114 and a ground. One of the two electrodes of the capacitor C64 is connected to the output terminal 114 and the other one of the two electrodes of the capacitor C63. The other one of the two electrodes of the capacitor C64 is connected to a ground.

The switches S61 through S63 are controlled to be ON mutually exclusively. That is, only one of the switches S61 through S63 is turned ON, while the remaining switches are turned OFF. Turning ON one of the switches S61 through S63 enables the pre-regulator circuit 10 to switch between the voltage levels of the voltages V2 through V4.

The pre-regulator circuit 10 as described above is configured to supply electric charge to the switched-capacitor circuit 20 via at least one of the output terminals 111 through 113.

According to an exemplary aspect, the pre-regulator circuit 10 can be configured to convert the input voltage (third voltage) into only one first voltage. In such a configuration, the pre-regulator circuit 10 may include at least the switches S71 and S72 and the power inductor L71.

[1.2.4 Circuit Configuration of Filter Circuit 40]

The circuit configuration of the filter circuit 40 will now be described below. As illustrated in FIG. 3, the filter circuit 40 includes inductors L51, L52, and L53, capacitors C51 and C52, a resistor R51, an input terminal 140, and an output terminal 141.

The input terminal 140 is an input terminal for the second voltage selected by the output switch circuit 30. That is, the input terminal 140 is a terminal for receiving the second voltage selected from among the voltages V1 through V4.

The output terminal 141 is an output terminal for the power supply voltage $V_{ET}$. That is, the output terminal 141 is a terminal for supplying the power supply voltage $V_{ET}$ to the power amplifier circuit 2.

The inductors L51 and L52 are connected in series with each other between the input terminal 140 and the output terminal 141. A series connection circuit of the inductor L53 and the resistor R51 is connected in parallel with the inductor L51. The capacitor C51 is connected between a ground and a node between the inductors L51 and L52. The capacitor C52 is connected between the output terminal 141 and a ground.

With the above-described configuration, the filter circuit 40 forms a LC low pass filter in which inductors are disposed on a series arm path and a capacitor is disposed on a parallel arm path. This enables the filter circuit 40 to reduce radio frequency components included in a power supply voltage. For example, if the predetermined band is a frequency band for frequency division duplex (FDD), the filter circuit 40 is configured to reduce components of the downlink operating band of the predetermined band.

The configuration of the filter circuit 40 shown in FIG. 3 is an example and the filter circuit 40 is not limited thereto. The filter circuit 40 may form a band pass filter or a high pass filter in accordance with the band to be eliminated.

The filter circuit 40 may include two or more LC filters. In this case, the two or more LC filters are connected to the same output terminal 130 and have individual pass bands or attenuation bands corresponding to different bands. Alternatively, a first filter group formed by two or more LC filters may be connected to a first output terminal of the output switch circuit 30, while a second filter group formed by another two or more LC filters may be connected to a second output terminal of the output switch circuit 30. Each LC filter may have a pass band or an attenuation band of a corresponding one of the different bands. In this case, the filter circuit 40 may include two or more output terminals and may simultaneously output two or more power supply voltages $V_{ET}$ to the power amplifier circuit 2.

According to an exemplary aspect, a tracker module can be formed by mounting the switches of the switched-capacitor circuit 20 and those of the output switch circuit 30 on a module substrate as a one-chip switch integrated circuit, the lines connecting the switches and the capacitors of the switched-capacitor circuit 20 most probably become long. Because of the application of digital ET to these lines, a high current flows through the lines due to high-speed charging and discharging of the capacitors. It is thus required to cause a high current to flow through the lines at low resistance. If these lines become long, a resistance loss in the lines increases. If the lines are made thick to prevent an increase in the resistance loss, the deviation of impedance occurs, which may degrade the output waveform of the power supply voltage $V_{ET}$ output from the tracker module.

Regarding a tracker module on which the power supply circuit 1 according to the embodiment is mounted, the configuration of the tracker module that makes it less likely to degrade the output characteristics of the power supply voltage $V_{ET}$ will be discussed below.

Figure 4:
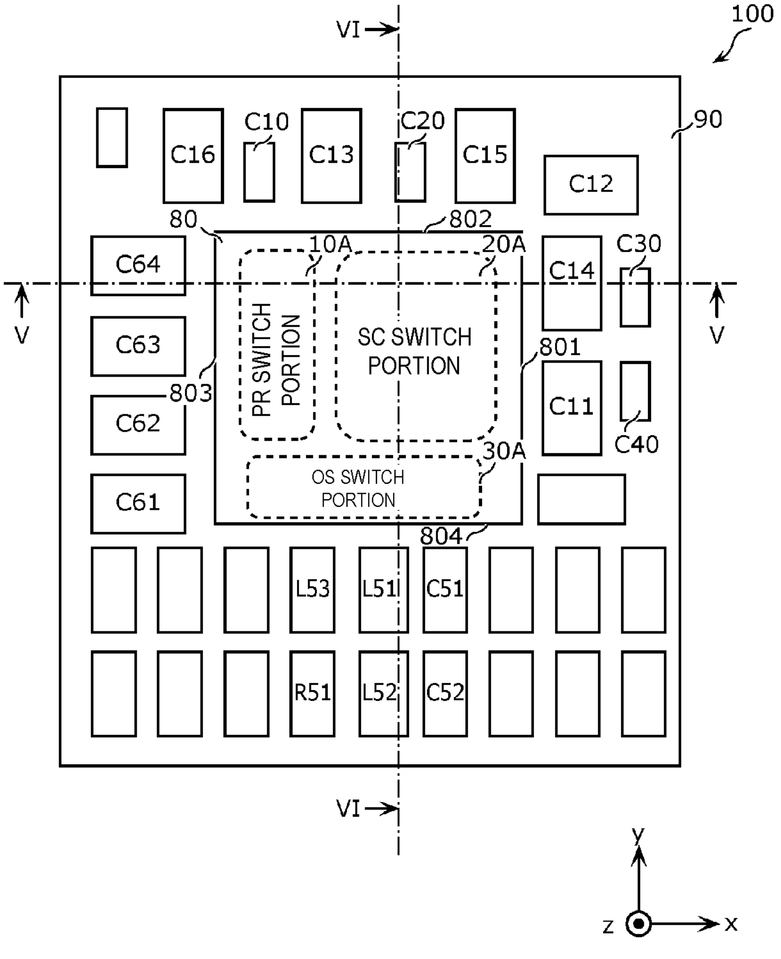
FIG. 4 is a plan view of a tracker module according to an exemplary aspect.
Figure 5:
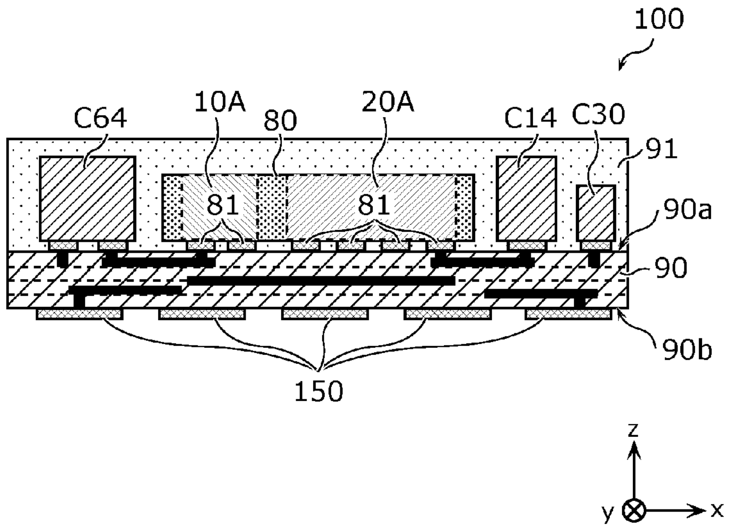
FIG. 5 is a first sectional view of the tracker module according to the exemplary aspect.
Figure 6:
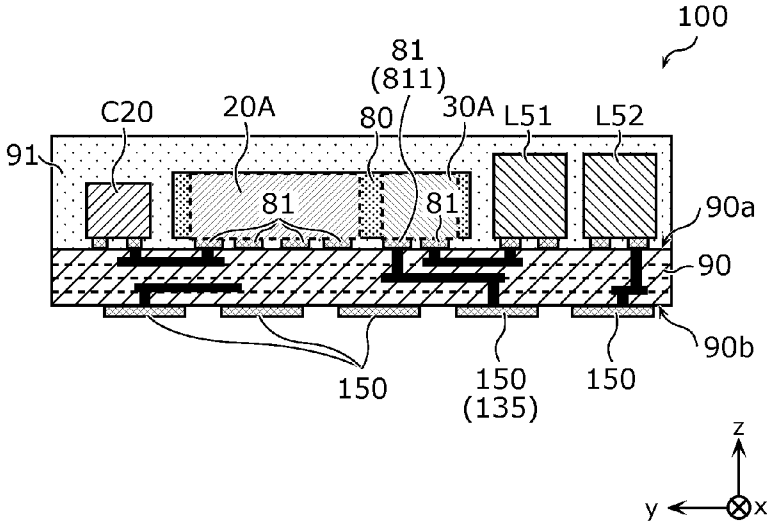
FIG. 6 is a second sectional view of the tracker module according to the exemplary aspect.

2 Configuration of Component Arrangement of Tracker Module 100 According to Example FIG. 4 is a plan view of a tracker module 100 according to an exemplary aspect. FIG. 5 is a first sectional view of the tracker module 100 according to the exemplary aspect, and more specifically, a sectional view taken along line V-V in FIG. 4. FIG. 6 is a second sectional view of the tracker module 100 according to the exemplary aspect, and more specifically, a sectional view taken along line VI-VI in FIG. 4. FIG. 4 shows the layout of circuit components mounted on a module substrate 90 having main surfaces 90*a* and 90*b* facing each other when the main surface 90*a* is seen from the positive side of the z axis. It is noted that according to an exemplary aspect, the module substrate 90 can be considered a module laminate and that the terms may be used interchangeably herein.

The tracker module 100 according to the example corresponds to a specific configuration of the arrangement of some of the circuit components of the power supply circuit 1 of the embodiment.

As illustrated in FIGS. 4 through 6, the tracker module 100 according to the example includes the module substrate 90, an integrated circuit 80, capacitors C10, C20, C30, C40, C11, C12, C13, C14, C15, C16, C51, C52, C61, C62, C63, and C64, inductors L51, L52, and L53, resistor R51, and resin member 91.

The module substrate 90 has main surfaces 90*a* and 90*b* facing each other. The module substrate 90 is a substrate for mounting circuit components forming the tracker module 100 thereon. As the module substrate 90, a low temperature co-fired ceramics (LTCC) substrate or a high temperature co-fired ceramics (HTCC) substrate having a multilayer structure formed by plural dielectric layers, a component-embedded board, a substrate having a redistribution layer (RDL), or a printed circuit board, for example, may be used.

According to an exemplary aspect, the integrated circuit 80 is a semiconductor IC (i.e., an integrated circuit) and is formed by a CMOS (Complementary Metal Oxide Semiconductor), for example, and more specifically, the integrated circuit 80 is manufactured by a SOI (Silicon on Insulator) process. The integrated circuit 80 may be made of at least one of GaAs, SiGe, and GaN. The semiconductor material for the integrated circuit 80 is not limited to the above-described materials.

The integrated circuit 80 includes a PR switch unit 10A, an SC switch unit 20A, an OS switch unit 30A, and plural input/output electrodes 81.

According to an exemplary aspect, the PR switch unit 10A is formed by the switches included in the pre-regulator circuit 10. More specifically, the PR switch unit 10A includes the switches S61, S62, S63, S71, and S72.

According to an exemplary aspect, the SC switch unit 20A is formed by the switches included in the switched-capacitor circuit 20. More specifically, the SC switch unit 20A includes the switches S11, S12, S13, S14, S21, S22, S23, S24, S31, S32, S33, S34, S41, S42, S43, and S44.

According to an exemplary aspect, the OS switch unit 30A is formed by the switches included in the output switch circuit 30. More specifically, the OS switch unit 30A includes the switches S51, S52, S53, and S54.

The capacitors C10, C20, C30, C40, C11, C12, C13, C14, C15, and C16 are capacitors included in the switched-capacitor circuit 20. The capacitors C51 and C52 are capacitors included in the filter circuit 40. The capacitors C61, C62, C63, and C64 are capacitors included in the pre-regulator circuit 10.

The plural input/output electrodes 81 are electrically connected to, for example, plural circuit components disposed on the main surface 90*a* or to plural external connection electrodes 150 disposed on the main surface 90*b* via wiring layers or via-conductors, for example, formed in the module substrate 90. The plural input/output electrodes 81 include an input electrode 811.

The input electrode 811 is an example of an input terminal and is connected to the RFIC 5 disposed outside the tracker module 100 via an external connection terminal 150 (control terminal 135).

The resin member 91 is disposed on the main surface 90*a* and covers the main surface 90*a* and some of the circuit components forming the tracker module 100. The resin member 91 has the function of securing the reliability, such as the mechanical strength and the moisture resistance, of the circuit components forming the tracker module 100.

Among the above-described capacitors C10 through C40, C11 through C16, C51, C52, and C61 through C64, the tracker module 100 may include at least one of the capacitors included in the switched-capacitor circuit 20. The integrated circuit 80 may include only the SC switch unit 20A and the OS switch unit 30A. The SC switch unit 20A may include at least one of the above-described switches S11 through S14, S21 through S24, S31 through S34, and S41 through S44. The OS switch unit 30A may include at least one of the above-described switches S51 through S54.

The integrated circuit 80 may include only the SC switch unit 20A and the OS switch unit 30A, and an integrated circuit different from the integrated circuit 80 may include the PR switch unit 10A. In this case, only the integrated circuit 80 may be disposed on the module substrate 90, or the two integrated circuits may be disposed on the module substrate 90.

On the main surface 90*b*, the external connection electrodes 150 are disposed. The tracker module 100 sends and receives electrical signals to and from the RFIC 5, power amplifier circuit 2, and an external substrate disposed on the negative side of the z axis of the tracker module 100 via the plural external connection electrodes 150. Some of the external connection electrodes 150 are set to a ground potential.

The external connection electrodes 150 may be planar electrodes, as shown in FIGS. 5 and 6, or may be bump electrodes formed on the main surface 90*b*.

Lines for connecting the circuit components shown in FIG. 3 are formed inside the module substrate 90 and on the main surfaces 90*a* and 90*b*, though they are not shown in FIG. 4. The line may be a bonding wire bonded at its both ends to the main surface 90*a* or 90*b* and one of the circuit components. The line may be a terminal, an electrode, or a line formed on the surface of a circuit component.

In the tracker module 100, the integrated circuit 80 and the capacitor C11 are adjacent to each other, the integrated circuit 80 and the capacitor C13 are adjacent to each other, the integrated circuit 80 and the capacitor C14 are adjacent to each other, the integrated circuit 80 and the capacitor C15 are adjacent to each other, and the integrated circuit 80 and the capacitor C16 are adjacent to each other.

In the example, the phrase "the integrated circuit 80 and the capacitor C11 are adjacent to each other" means that the integrated circuit 80 and the capacitor C11 are disposed close to each other, and more specifically, no circuit component is located in a space sandwiched between a side surface of the integrated circuit 80 and a side surface of the capacitor C11 facing each other. The circuit components include active components, such as transistors and diodes, and passive components, such as inductors, transformers, capacitors, and resistors, and do not include terminals, connectors, electrodes, wiring, and resin members.

In the switched-capacitor circuit 20, as a result of the capacitors repeatedly performing charging and discharging at high speed, highly accurate and stable multiple second voltages can be supplied to the output switch circuit 30. To achieve this operation, the lines connecting the capacitors and switches to be connected to these capacitors can transfer electric charge at high speed and at low resistance.

To address this issue, since the integrated circuit 80 and capacitors of the switched-capacitor circuit 20 are adjacent to each other, the length of the lines connecting the capacitors and the switches of the SC switch unit 20A can be made it short, thereby lowering parasitic resistance and parasitic inductance in these lines in the switched-capacitor circuit 20. Hence, highly accurate and stable multiple second voltages can be supplied from the switched-capacitor circuit 20 to the output switch circuit 30. This configuration makes it less likely to degrade the output waveform of the power supply voltage $V_{ET}$ output from the tracker module 100.

In the example, the SC switch unit 20A of the integrated circuit 80 and the capacitor C11 are adjacent to each other. With this configuration, the length of the line connecting the capacitor C11 and switches of the SC switch unit 20A can be made it short, thereby further lowering parasitic resistance and parasitic inductance in this line in the switched-capacitor circuit 20.

At least one of the capacitors C10 through C40 and C11 through C16 and the integrated circuit 80 may be adjacent to each other. This configuration makes the length of the line connecting the at least one of the capacitors C10 through C40 and C11 through C16 and switches of the SC switch unit 20A, thereby reducing parasitic resistance and parasitic inductance in this line. Hence, highly accurate and stable multiple second voltages can be supplied from the switched-capacitor circuit 20 to the output switch circuit 30.

It is desirable that the integrated circuit 80 and the capacitor C11 be adjacent to each other and/or the integrated circuit and the capacitor C14 be adjacent to each other.

Among the plural capacitors included in the switched-capacitor circuit 20, the capacitors C11 and C14 are those to which the highest potential (voltage V4) is applied. The amount of electric charge transferred in the line connected to the capacitor C11 and in the line connected to the capacitor C14 is greater than that of the other lines. In the above-described configuration, these lines can be made it short, thereby making it possible to supply second voltages having highly accurate and stable high voltage levels from the switched-capacitor circuit 20 to the output switch circuit 30. This configuration effectively suppresses the degradation of the output waveform of the power supply voltage $V_{ET}$ output from the tracker module 100.

In a plan view of the module substrate 90, the outer periphery of the integrated circuit 80 has a rectangular shape and the integrated circuit 80 has four sides 801, 802, 803, and 804. The capacitor C14 is adjacent to the side 801 (e.g., a first side), while the capacitor C15 is adjacent to the side 802 (e.g., a second side).

With this configuration, while the line connected to the capacitor C14 and the line connected to the capacitor C15 can be made it short, heat generated from one of these two lines and that from the other line can be dissipated separately from each other. This configuration improves the heat dissipation of the tracker module 100. A combination of two capacitors separately disposed adjacent to two different sides of the integrated circuit 80 are not limited to the capacitors C14 and C15 and may be any combination of two of the capacitors included in the switched-capacitor circuit 20.

The capacitors C13, C10, and C16 are each adjacent to the side 802. The capacitors C13 and C16 are a pair of flying capacitors that complementarily perform charging and discharging. The capacitor C10 is a smoothing capacitor that smooths the voltage of the capacitors C13 and C16 and the voltage at the node N1.

This configuration makes the line connecting the capacitors C13, C10, and C16 therebetween short, thereby reducing parasitic resistance and parasitic inductance in this line. Thus, highly accurate and stable multiple second voltages can be supplied from the switched-capacitor circuit 20 to the output switch circuit 30.

The capacitor C10 is disposed between the capacitors C13 and C16.

With this configuration, since a smoothing capacitor is disposed between a pair of flying capacitors, the interaction of heat generated from the capacitor C13 and that from the capacitor C16 can be lessened, thereby effectively improving the heat dissipation and suppressing the degradation of the characteristics.

Each of the capacitors C61, C62, C63, and C64 is adjacent to the integrated circuit 80.

With this configuration, since the integrated circuit 80 and the capacitors of the pre-regulator circuit 10 are adjacent to each other, the lines connecting the capacitors and the switches of the PR switch unit 10A can be made it short, thereby lowering parasitic resistance and parasitic inductance in these lines in the pre-regulator circuit 10. Hence, a highly accurate and stable first voltage can be supplied from the pre-regulator circuit 10 to the switched-capacitor circuit 20. This configuration makes it less likely to degrade the output waveform of the power supply voltage $V_{ET}$ output from the tracker module 100.

In the example, the PR switch unit 10A of the integrated circuit 80 and each of the capacitors C61 through C64 are adjacent to each other.

With this configuration, the lines connecting the capacitors C61 through C64 and the switches of the PR switch unit 10A can be made it even shorter, thereby further lowering parasitic resistance and parasitic inductance in these lines in the pre-regulator circuit 10. It is thus possible to reduce the occurrence of ringing, which would be caused by the parasitic inductance, during the switching operation of the switches of the PR switch unit 10A.

At least one of the capacitors C61 through C64 and the integrated circuit 80 may be adjacent to each other.

In the example, the integrated circuit 80 and each of the inductors L51 and L53 and the capacitor C51 are adjacent to each other.

With this configuration, since the integrated circuit 80 and circuit components of the filter circuit 40 are adjacent to each other, the lines connecting these circuit components and the switches of the OS switch unit 30A can be made it short, thereby lowering parasitic resistance and parasitic inductance in the lines connecting the filter circuit 40 and the output switch circuit 30. Hence, highly accurate and stable power supply voltage $V_{ET}$ can be output from the filter circuit 40.

With this configuration, the OS switch unit 30A of the integrated circuit 80 and each of the inductors L51 and L53 and the capacitor C51 are adjacent to each other.

With this configuration, the lines connecting the inductors L51 and L53 and the capacitor C51 and the switches of the OS switch unit 30A can be made it even shorter, thereby further lowering parasitic resistance and parasitic inductance in the lines connecting the filter circuit 40 and the output switch circuit 30. It is thus possible to suppress the degradation of the bandpass characteristics and attenuation characteristics of the filter circuit 40, which would be caused by a decrease in the Q factor of the inductance of the lines due to the parasitic resistance.

The tracker module 100 according to the example includes the module substrate 90, pre-regulator circuit 10 (except for the power inductor L71), switched-capacitor circuit 20, output switch circuit 30, and filter circuit 40.

The switched-capacitor circuit 20 includes the switches S11 through S14, S21 through S24, S31 through S34, and S41 through S44 and the capacitors C10 through C40 and C11 through C16. The output switch circuit 30 includes the switches S51 through S54. The switches S11 through S14, S21 through S24, S31 through S34, and S41 through S44 and the switches S51 through S54 are included in the integrated circuit 80. The capacitors C10 through C40 and C11 through C16 and the integrated circuit 80 are disposed on the module substrate 90. The integrated circuit 80 and at least one of the capacitors C10 through C40 and C11 through C16 are adjacent to each other.

With this configuration, since the integrated circuit 80 and capacitors of the switched-capacitor circuit 20 are adjacent to each other, the length of the lines connecting the capacitors and the switches of the SC switch unit 20A can be made it short, thereby lowering parasitic resistance and parasitic inductance in these lines in the switched-capacitor circuit 20. Hence, highly accurate and stable multiple second voltages can be supplied from the switched-capacitor circuit 20 to the output switch circuit 30. This configuration makes it less likely to degrade the output waveform of the power supply voltage $V_{ET}$ output from the tracker module 100.

The provision of the pre-regulator circuit 10 and the filter circuit 40 for the tracker module 100 may be omitted.

3 Technical Advantages

As described above, a tracker module 100 according to the example includes a module substrate 90, an integrated circuit 80 disposed on the module substrate 90, and a capacitor disposed on the module substrate 90 and included in a switched-capacitor circuit 20. The switched-capacitor circuit 20 generates multiple discrete voltages based on an input voltage. The integrated circuit 80 includes a switch included in the switched-capacitor circuit 20 and a switch included in an output switch circuit 30. The output switch circuit 30 selectively outputs at least one of the multiple discrete voltages based on an envelope voltage. The integrated circuit 80 and the capacitor are adjacent to each other.

Because of the application of digital ET, it is necessary that the switched-capacitor circuit 20 highly accurately and stably supply multiple second voltages, which sharply fluctuate, to the output switch circuit 30 as a result of the capacitors repeatedly performing charging and discharging at high speed. To meet this demand, a line connecting a capacitor and a switch to be connected to this capacitor can be provided to transfer electric charge at high speed and at low resistance.

With the above-described configuration, since the integrated circuit 80 and the capacitor of the switched-capacitor circuit 20 are adjacent to each other, the length of the line connecting the capacitor and the switch of the SC switch unit 20A can be made it short, thereby lowering parasitic resistance and parasitic inductance in the line in the switched-capacitor circuit 20. Hence, highly accurate and stable multiple discrete voltages can be supplied from the switched-capacitor circuit 20 to the output switch circuit 30. It is thus possible to make it less likely to degrade the output waveform of the power supply voltage $V_{ET}$ output from the tracker module 100.

The tracker module 100 according to the example includes a module substrate 90, a switched-capacitor circuit 20, and an output switch circuit 30. The switched-capacitor circuit 20 generates multiple discrete voltages based on an input voltage. The output switch circuit 30 includes an input terminal 811 connected to a control circuit and selectively outputs at least one of the multiple discrete voltages. The switched-capacitor circuit 20 includes a switch and a capacitor. The output switch circuit 30 includes a switch. The switch of the switched-capacitor circuit 20 and the switch of the output switch circuit 30 are included in an integrated circuit 80. The capacitor and the integrated circuit 80 are disposed on the module substrate 90. The integrated circuit 80 and the capacitor are adjacent to each other.

With this configuration, since the integrated circuit 80 and the capacitor of the switched-capacitor circuit 20 are adjacent to each other, parasitic resistance and parasitic inductance in a line connecting the capacitor of the switched-capacitor circuit 20 and the switch of the switched-capacitor circuit 20 can be reduced. Hence, highly accurate and stable multiple discrete voltages can be supplied from the switched-capacitor circuit 20 to the output switch circuit 30. It is thus possible to make it less likely to degrade the output waveform of the power supply voltage $V_{ET}$ output from the tracker module 100.

Additionally, for example, in the tracker module 100, among plural capacitors included in the switched-capacitor circuit 20, the above-described capacitor may be a capacitor to which the highest potential is applied.

With this configuration, parasitic resistance and parasitic inductance in the line in which the largest amount of electric charge is transferred can be reduced. It is thus possible to effectively suppress the degradation of the output waveform of the power supply voltage $V_{ET}$ output from the tracker module 100.

Additionally, for example, in the tracker module 100, the switched-capacitor circuit 20 may include two capacitors, each of the two capacitors being the above-described capacitor. In a plan view of the module substrate 90, the outer periphery of the integrated circuit 80 may have a rectangular shape. One of the two capacitors may be adjacent to a side 801 of the integrated circuit 80. The other one of the two capacitors may be adjacent to a side 802, which is different from the side 801, of the integrated circuit 80.

With this configuration, while the lines connected to the two capacitors can be made it short, heat generated from one of the two lines and that from the other line can be dissipated separately from each other. This configuration improves the heat dissipation of the tracker module 100.

Additionally, for example, in the tracker module 100, the switched-capacitor circuit 20 may include plural capacitors, each of the plural capacitors being the above-described capacitor. The plural capacitors may include a pair of capacitors C13 and C16 that complementarily perform charging and discharging and a capacitor C10 that smooths the voltage of the capacitors C13 and C16. In a plan view of the module substrate 90, the outer periphery of the integrated circuit 80 may have a rectangular shape. Each of the capacitors C13, C16, and C10 may be adjacent to the side 802 forming the outer periphery of the integrated circuit 80.

This configuration makes the line connecting the capacitors C13, C10, and C16 therebetween short, thereby reducing parasitic resistance and parasitic inductance in this line. It is thus possible to supply highly accurate and stable multiple second voltages from the switched-capacitor circuit 20 to the output switch circuit 30.

Additionally, for example, in the tracker module 100, in a plan view of the module substrate 90, the capacitor C10 may be disposed between the capacitors C13 and C16.

With this configuration, since a smoothing capacitor is disposed between a pair of flying capacitors, the interaction of heat generated from the capacitor C13 and that from the capacitor C16 can be lessened, thereby effectively improving the heat dissipation and suppressing the degradation of the characteristics.

Additionally, for example, the tracker module 100 may include a capacitor included in a pre-regulator circuit 10. The pre-regulator circuit 10 converts the input voltage into a first voltage by using a power inductor and outputs the first voltage to the switched-capacitor circuit 20. The integrated circuit 80 may include a switch included in the pre-regulator circuit 10. The integrated circuit 80 and the capacitor of the pre-regulator circuit 10 may be adjacent to each other.

With this configuration, since the integrated circuit 80 and the capacitor of the pre-regulator circuit 10 are adjacent to each other, the line connecting the capacitor and the switch of the PR switch unit 10A can be made it short, thereby lowering parasitic resistance and parasitic inductance in the line in the pre-regulator circuit 10. It is thus possible to supply a highly accurate and stable first voltage from the pre-regulator circuit 10 to the switched-capacitor circuit 20.

Additionally, for example, the tracker module 100 may include a circuit component included in a filter circuit 40. At least one of the multiple discrete voltages is input into the filter circuit 40. The integrated circuit 80 and the circuit component may be adjacent to each other.

With this configuration, since the integrated circuit 80 and the circuit component of the filter circuit 40 are adjacent to each other, the line connecting the circuit component and the switch of the OS switch unit 30A can be made it short, thereby lowering parasitic resistance and parasitic inductance in the line connecting the filter circuit 40 and the output switch circuit 30.

The tracker module 100 according to the example includes a module substrate 90 and first and second circuits. The first circuit includes a capacitor C12 including first and second electrodes, a capacitor C15 including third and fourth electrodes, and switches S21, S32, S22, S31, S23, S34, S24, and S33. One end of the switch S21 and one end of the switch S22 are connected to the first electrode. One end of the switch S32 and one end of the switch S31 are connected to the second electrode. One end of the switch S23 and one end of the switch S24 are connected to the third electrode. One end of the switch S34 and one end of the switch S33 are connected to the fourth electrode. The other end of the switch S21, the other end of the switch S32, the other end of the switch S23, and the other end of the switch S34 are connected to each other. The other end of the switch S22 is connected to the other end of the switch S24. The other end of the switch S31 is connected to the other end of the switch S33. The second circuit includes an output terminal 130 and switches S53 and S52. The switch S53 is connected between the output terminal 130 and each of the other end of the switch S21, the other end of the switch S32, the other end of the switch S23, and the other end of the switch S34. The switch S52 is connected between the output terminal 130 and each of the other end of the switch S22 and the other end of the switch S24. The switches S21, S22, S23, S24, S31, S32, S33, S34, S52, and S53 are included in an integrated circuit 80. The capacitors C12 and C15 and the integrated circuit 80 are disposed on the module substrate 90. The integrated circuit 80 and one of the capacitors C12 and C15 are adjacent to each other.

With this configuration, since the integrated circuit 80 and one of the capacitors C12 and C15 are adjacent to each other, the lines connecting the capacitor adjacent to the integrated circuit 80 and the switches of the first circuit can be made short, thereby reducing parasitic resistance and parasitic inductance in these lines in the first circuit. Hence, highly accurate and stable multiple second voltages can be supplied from the first circuit to the second circuit. It is thus possible to make it less likely to degrade the output waveform of the power supply voltage $V_{ET}$ output from the tracker module 100.

Additionally, for example, in the tracker module 100, among plural capacitors included in the first circuit, the capacitors C12 and C15 may be capacitors to which the highest potential is applied.

With this configuration, parasitic resistance and parasitic inductance in the line in which the largest amount of electric charge is transferred can be reduced. It is thus possible to effectively suppress the degradation of the output waveform of the power supply voltage $V_{ET}$ output from the tracker module 100.

Additionally, for example, in the tracker module 100, the first circuit may include plural capacitors including the capacitors C12 and C15. In a plan view of the module substrate 90, the outer periphery of the integrated circuit 80 may have a rectangular shape. One of the capacitors C12 and C15 may be adjacent to a first side forming the outer periphery of the integrated circuit 80. One of the plural capacitors other than the capacitor C12 or C15 which is adjacent to the first side may be adjacent to a second side, which is different from the first side.

With this configuration, while two lines connected to the two capacitors adjacent to the first and second sides can be made it short, heat generated from one of the two lines and that from the other line can be dissipated separately from each other. This configuration improves the heat dissipation of the tracker module 100.

Additionally, for example, in the tracker module 100, the first circuit may include a capacitor C10 including fifth and sixth electrodes as well as the capacitor C13 including the first and second electrodes and the capacitor C16 including the third and fourth electrodes. The fifth electrode may be connected to the other end of the switch S31, the other end of the switch S42, the other end of the switch S33, and the other end of the switch S44. The sixth electrode may be connected to the other end of the switch S41 and the other end of the switch 43. In a plan view of the module substrate 90, the outer periphery of the integrated circuit 80 may have a rectangular shape. Each of the capacitors C13, C16, and C10 may be adjacent to a first side forming the outer periphery of the integrated circuit 80.

Additionally, for example, in the tracker module 100, in a plan view of the module substrate 90, the capacitor C10 may be disposed between the capacitors C13 and C16.

Additionally, for example, the tracker module 100 may further include a third circuit. The third circuit may include an input terminal 110, switches S71, S72, and S63, and a capacitor C63. The switch S71 is connected between the input terminal 110 and one end of a power inductor L71. The switch S72 is connected between one end of the power inductor L71 and a ground. The switch S63 is connected between the other end of the power inductor L71 and each of the other end of the switch S21, the other end of the switch S32, the other end of the switch S23, and the other end of the switch S34. The capacitor C63 is connected between one end of the switch S63 and a ground. The switches S63, S71, and S72 may be included in the integrated circuit 80. The capacitor C63 may be disposed on the module substrate 90. The integrated circuit 80 and the capacitor C63 may be adjacent to each other.

With this configuration, since the integrated circuit 80 and the capacitor C63 are adjacent to each other, the lines connecting this capacitor and the switches of the third circuit can be made it short, thereby lowering parasitic resistance and parasitic inductance in these lines in the third circuit. It is thus possible to supply a highly accurate and stable first voltage from the third circuit to the second circuit.

Additionally, for example, the tracker module 100 may further include a fourth circuit connected to the output terminal 130. The fourth circuit may form an LC filter including a circuit component which is one of an inductor, a capacitor, and a resistor element. The circuit component may be disposed on the module substrate 90. The integrated circuit 80 and the circuit component may be adjacent to each other.

A communication device 7 according to the embodiment includes an RFIC 5, a power amplifier circuit 2, and the tracker module 100. The RFIC 5 processes a radio-frequency signal. The power amplifier circuit 2 transfers the radio-frequency signal between the RFIC 5 and an antenna

6. The tracker module 100 supplies a power supply voltage $V_{ET}$ to the power amplifier circuit 2.

With this configuration, the communication device 7 can achieve advantages similar to the above-described technical advantages of the tracker module 100.

Additional Exemplary Embodiments

The tracker module and the communication device according to the exemplary aspects of the present disclosure have been discussed above through illustration of the embodiment and example. However, the tracker module and the communication device according to the exemplary aspects are not limited to the above-described embodiment and example. Additional exemplary embodiments implemented by combining certain elements in the above-described embodiment and example and modified examples obtained by making various modifications to the above-described embodiment and example by those skilled in the art without departing from the scope and spirit of the invention are also encompassed in the invention. Various types of equipment integrating the above-described tracker module and communication device are also encompassed in the invention.

In one example, in the circuit configurations of the tracker module and the communication device according to the above-described embodiment, another circuit element and another line may be inserted onto a path connecting circuit elements and a signal path illustrated in the drawings.

REFERENCE SIGNS LIST

1 power supply circuit
2 power amplifier circuit
3 filter
4 PA control circuit
5 RFIC
6 antenna
7 communication device
10 pre-regulator circuit
10A PR switch unit
20 switched-capacitor circuit
20A SC switch unit
30 output switch circuit
30A OS switch unit
40 filter circuit
50 DC power source
80 integrated circuit
81 input/output electrode
90 module substrate
90*a*, 90*b* main surface
91 resin member
100 tracker module
110, 131, 132, 133, 134, 140 input terminal
111, 112, 113, 114, 130, 141 output terminal
115, 116 inductor connection terminal
117, 120, 135 control terminal
150 external connection terminal
801, 802, 803, 804 side
811 input electrode
C10, C11, C12, C13, C14, C15, C16, C20, C30, C40, C51, C52, C61, C62, C63, C64 capacitor
L51, L52, L53 inductor
L71 power inductor
R51 resistor
S11, S12, S13, S14, S21, S22, S23, S24, S31, S32, S33, S34, S41, S42, S43, S44, S51, S52, S53, S54, S61, S62, S63, S71, S72 switch

The invention claimed is:

1. A tracker module comprising:
a module substrate;
an integrated circuit disposed on the module substrate; and
a capacitor disposed on the module substrate and included in a switched-capacitor circuit that is configured to generate a plurality of discrete voltages based on an input voltage,
wherein the integrated circuit includes a switch included in the switched-capacitor circuit and a switch included in an output switch circuit that is configured to selectively output at least one of the plurality of discrete voltages based on an envelope voltage, and
wherein the integrated circuit is disposed adjacent to the capacitor on the module substrate, such that no circuit component is disposed in a space between a side surface of the integrated circuit and a side surface of the capacitor that face each other.

2. The tracker module according to claim 1, wherein the capacitor is a capacitor of a plurality of capacitors included in the switched-capacitor circuit that has a highest potential applied thereto.

3. The tracker module according to claim 1, wherein:
the switched-capacitor circuit includes two capacitors including the capacitor;
in a plan view of the module substrate, an outer periphery of the integrated circuit has a rectangular shape;
a first capacitor of the two capacitors is disposed adjacent to a first side of the outer periphery of the integrated circuit; and
a second capacitor of the two capacitors is disposed adjacent to a second side of the outer periphery of the integrated circuit, the second side being a side different than the first side.

4. The tracker module according to claim 1, wherein:
the switched-capacitor circuit includes a plurality of capacitors including the capacitor;
the plurality of capacitors include:
a pair of flying capacitors that are configured to be complementarily charged and discharged, and
a smoothing capacitor that is configured to smooth a voltage of the pair of flying capacitors;
in a plan view of the module substrate, an outer periphery of the integrated circuit has a rectangular shape; and
each of the pair of flying capacitors and the smoothing capacitor is adjacent to a first side of the outer periphery of the integrated circuit.

5. The tracker module according to claim 4, wherein, in the plan view of the module substrate, the smoothing capacitor is disposed between the pair of flying capacitors.

6. The tracker module according to claim 1, further comprising:
a capacitor included in a pre-regulator circuit that is configured to convert the input voltage into a first voltage and to output the first voltage to the switched-capacitor circuit,
wherein the integrated circuit includes a switch included in the pre-regulator circuit, and the integrated circuit is disposed adjacent to the capacitor of the pre-regulator circuit.

7. The tracker module according to claim 1, further comprising:
an additional circuit component included in a filter circuit, wherein at least one of the plurality of discrete voltages is input into the filter circuit, and wherein the integrated circuit is disposed adjacent to the additional circuit component.

8. A tracker module comprising:

a module substrate;

a first circuit that includes:

a first capacitor including first and second electrodes, a second capacitor including third and fourth electrodes, and first, second, third, fourth, fifth, sixth, seventh, and eighth switches, wherein:

a first end of the first switch and a first end of the third switch are connected to the first electrode, a first end of the second switch and a first end of the fourth switch are connected to the second electrode, a first end of the fifth switch and a first end of the seventh switch are connected to the third electrode, a first end of the sixth switch and a first end of the eighth switch are connected to the fourth electrode, a second end of the first switch, a second end of the second switch, a second end of the fifth switch, and a second end of the sixth switch are connected to each other, a second end of the third switch is connected to a second end of the seventh switch, and a second end of the fourth switch is connected to a second end of the eighth switch; and a second circuit that includes:

a first output terminal, a ninth switch connected between the first output terminal and each of the second ends of the first switch, the second switch, the fifth switch, and the sixth switch, and a tenth switch connected between the first output terminal and each of the second ends of the third switch and the seventh switch, wherein the first through tenth switches are included in an integrated circuit, wherein the first and second capacitors and the integrated circuit are disposed on the module substrate, and wherein the integrated circuit is disposed adjacent to at least one of the first and second capacitors.

9. The tracker module according to claim 8, wherein the first and second capacitors are among a plurality of capacitors included in the first circuit that have a highest potential applied thereto.

10. The tracker module according to claim 8, wherein:

the first circuit includes a plurality of capacitors including the first and second capacitors;

in a plan view of the module substrate, an outer periphery of the integrated circuit has a rectangular shape;

the first capacitor is disposed adjacent to a first side of the outer periphery of the integrated circuit; and the second capacitor is disposed adjacent to a second side of the outer periphery of the integrated circuit that is a side different from the first side.

11. The tracker module according to claim 8, wherein:

the first circuit further includes a third capacitor that includes fifth and sixth electrodes;

the fifth electrode is connected to the second end of the first switch, the second end of the second switch, the second end of the fifth switch, and the second end of the sixth switch;

the sixth electrode is connected to the second end of the third switch and the second end of the seventh switch or to the second end of the fourth switch and the second end of the eighth switch;

in a plan view of the module substrate, an outer periphery of the integrated circuit has a rectangular shape; and each of the first capacitor, the second capacitor, and the third capacitor is disposed adjacent to a first side of the outer periphery of the integrated circuit.

12. The tracker module according to claim 11, wherein, in the plan view of the module substrate, the third capacitor is disposed between the first and second capacitors.

13. The tracker module according to claim 8, further comprising:

a third circuit that includes:

a third input terminal, an eleventh switch connected between the third input terminal and a first end of a power inductor, a twelfth switch connected between a first end of the power inductor and a ground, and a fourth capacitor connected between a second end of the power inductor and the ground, wherein the eleventh and twelfth switches are included in the integrated circuit, wherein the fourth capacitor is disposed on the module substrate, and wherein the integrated circuit is disposed adjacent to the fourth capacitor.

14. The tracker module according to claim 8, further comprising a fourth circuit connected to the first output terminal and configured to form an LC filter that includes a circuit component that is at least one of an inductor, a capacitor, and a resistor element.

15. The tracker module according to claim 14, wherein the circuit component is disposed on the module substrate and adjacent to the integrated circuit.

16. A communication device comprising:

a signal processing circuit configured to process a radio-frequency signal;

a power amplifier circuit configured to transfer the radio-frequency signal between the signal processing circuit and an antenna; and the tracker module according to claim 1 that is configured to supply a power supply voltage to the power amplifier circuit.

17. A tracker module comprising:

a module substrate;

a switched-capacitor circuit that includes a switch and a capacitor and that is configured to generate a plurality of discrete voltages based on an input voltage;

an output switch circuit that includes a switch and an input terminal connected to a control circuit and that is configured to selectively output at least one of the plurality of discrete voltages; and an integrated circuit that includes the switch of the switched-capacitor circuit and the switch of the output switch circuit, wherein the capacitor and the integrated circuit are disposed on the module substrate and adjacent to each other, such that no circuit component is disposed in a space between a side surface of the integrated circuit and a side surface of the capacitor that face each other.

18. The tracker module according to claim 17, wherein the capacitor is a capacitor of a plurality of capacitors included in the switched-capacitor circuit that has a highest potential applied thereto.

19. The tracker module according to claim 17, wherein:

the switched-capacitor circuit includes a plurality of capacitors including the capacitor, the plurality of capacitors include:

a pair of flying capacitors that are configured to be complementarily charged and discharged, and a smoothing capacitor that is configured to smooth a voltage of the pair of flying capacitors, in a plan view of the module substrate, an outer periphery of the integrated circuit has a rectangular shape, and each of the pair of flying capacitors and the smoothing capacitor is disposed adjacent to a first side of the outer periphery of the integrated circuit.

20. The tracker module according to claim 19, wherein, in the plan view of the module substrate, the smoothing capacitor is disposed between the pair of flying capacitors.

* * * * *